(12) United States Patent
Sugahara et al.

(10) Patent No.: US 12,236,139 B2
(45) Date of Patent: *Feb. 25, 2025

(54) SEMICONDUCTOR MEMORY DEVICE

(71) Applicant: Kioxia Corporation, Tokyo (JP)

(72) Inventors: Akio Sugahara, Yokohama Kanagawa (JP); Masahiro Yoshihara, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/331,804

(22) Filed: Jun. 8, 2023

(65) Prior Publication Data

US 2023/0315343 A1 Oct. 5, 2023

Related U.S. Application Data

(63) Continuation of application No. 17/403,542, filed on Aug. 16, 2021, now Pat. No. 11,714,575, which is a (Continued)

(30) Foreign Application Priority Data

Jan. 30, 2019 (JP) ................................ 2019-014012

(51) Int. Cl.
*G06F 3/06* (2006.01)
*G06F 12/10* (2016.01)
(Continued)

(52) U.S. Cl.
CPC ............ *G06F 3/0659* (2013.01); *G06F 3/061* (2013.01); *G06F 3/0679* (2013.01); *G06F 12/10* (2013.01);
(Continued)

(58) Field of Classification Search
CPC ...... G06F 3/0659; G06F 3/061; G06F 3/0679; G06F 12/10; G06F 12/0246;
(Continued)

(56) References Cited

U.S. PATENT DOCUMENTS 8,456,905 B2 6/2013 Kasorla et al.
8,531,879 B2 9/2013 Hwang et al.
(Continued)

FOREIGN PATENT DOCUMENTS

CN 107146639 A 9/2017
TW 201810284 A 3/2018
(Continued)

*Primary Examiner* — Hiep T Nguyen
(74) *Attorney, Agent, or Firm* — Kim & Stewart LLP

(57) ABSTRACT

A semiconductor memory device includes first and second planes of memory cells, and a control circuit configured to perform a write operation on the memory cells to store first and second bits per memory cell, and to perform a first read operation using a first read voltage to read the first bits and a second read operation using second and third read voltages to read the second bits. In response to a first instruction, the control circuit performs the first and second read operations to read the first bits from the first plane and the second bits from the second plane, respectively. In response to a second read instruction, the control circuit performs the second and first read operations to read the second bits from the first plane and the first bits from the second plane, respectively.

20 Claims, 14 Drawing Sheets

Related U.S. Application Data continuation of application No. 16/556,043, filed on Aug. 29, 2019, now Pat. No. 11,093,172.

(51) Int. Cl.
*G11C 16/04* (2006.01)
*G11C 16/10* (2006.01)
*G11C 16/26* (2006.01)

(52) U.S. Cl.
CPC .......... *G11C 16/0483* (2013.01); *G11C 16/10* (2013.01); *G11C 16/26* (2013.01); *G06F 2212/657* (2013.01)

(58) Field of Classification Search
CPC ....... G06F 2212/657; G06F 2212/1016; G06F 2212/7208; G06F 2212/7201; G11C 16/0483; G11C 16/10; G11C 16/26; G11C 16/08; G11C 16/24; G11C 11/1562; Y02D 10/00
See application file for complete search history.

(56) References Cited

U.S. PATENT DOCUMENTS

| | | | |
|---|---|---|---|
| 11,714,575 B2* | 8/2023 | Sugahara | G06F 12/10 |
| | | | 711/103 |
| 2005/0157548 A1 | 7/2005 | Nakajima et al. | |
| 2015/0262682 A1 | 9/2015 | Futatsuyama et al. | |
| 2015/0262685 A1 | 9/2015 | Shirakawa et al. | |
| 2017/0140824 A1 | 5/2017 | Kwak et al. | |
| 2017/0255514 A1 | 9/2017 | Honma | |
| 2017/0365335 A1 | 12/2017 | Wang et al. | |
| 2018/0114580 A1 | 4/2018 | Alrod et al. | |
| 2018/0144782 A1 | 5/2018 | Noguchi et al. | |
| 2018/0261290 A1 | 9/2018 | Uehara et al. | |
| 2018/0277180 A1 | 9/2018 | Yoshida | |
| 2019/0205247 A1 | 7/2019 | Lin | |

FOREIGN PATENT DOCUMENTS

| | | |
|---|---|---|
| TW | 201820342 A | 6/2018 |
| TW | 201833934 A | 9/2018 |

* cited by examiner

SEMICONDUCTOR MEMORY DEVICE

CROSS-REFERENCE TO RELATED APPLICATION(S)

This application is a continuation of U.S. patent application Ser. No. 17/403,542, filed Aug. 16, 2021, which is a continuation of U.S. patent application Ser. No. 16/556,043, filed Aug. 29, 2019, now U.S. Pat. No. 11,093,172, issued Aug. 17, 2021, which is based upon and claims the benefit of priority from Japanese Patent Application No. 2019-014012, filed Jan. 30, 2019, the entire contents of which are incorporated herein by reference.

FIELD

Embodiments described herein relate generally to a semiconductor memory device.

BACKGROUND

A NAND-type flash memory is known as a semiconductor memory device.

DETAILED DESCRIPTION

Figure 1:
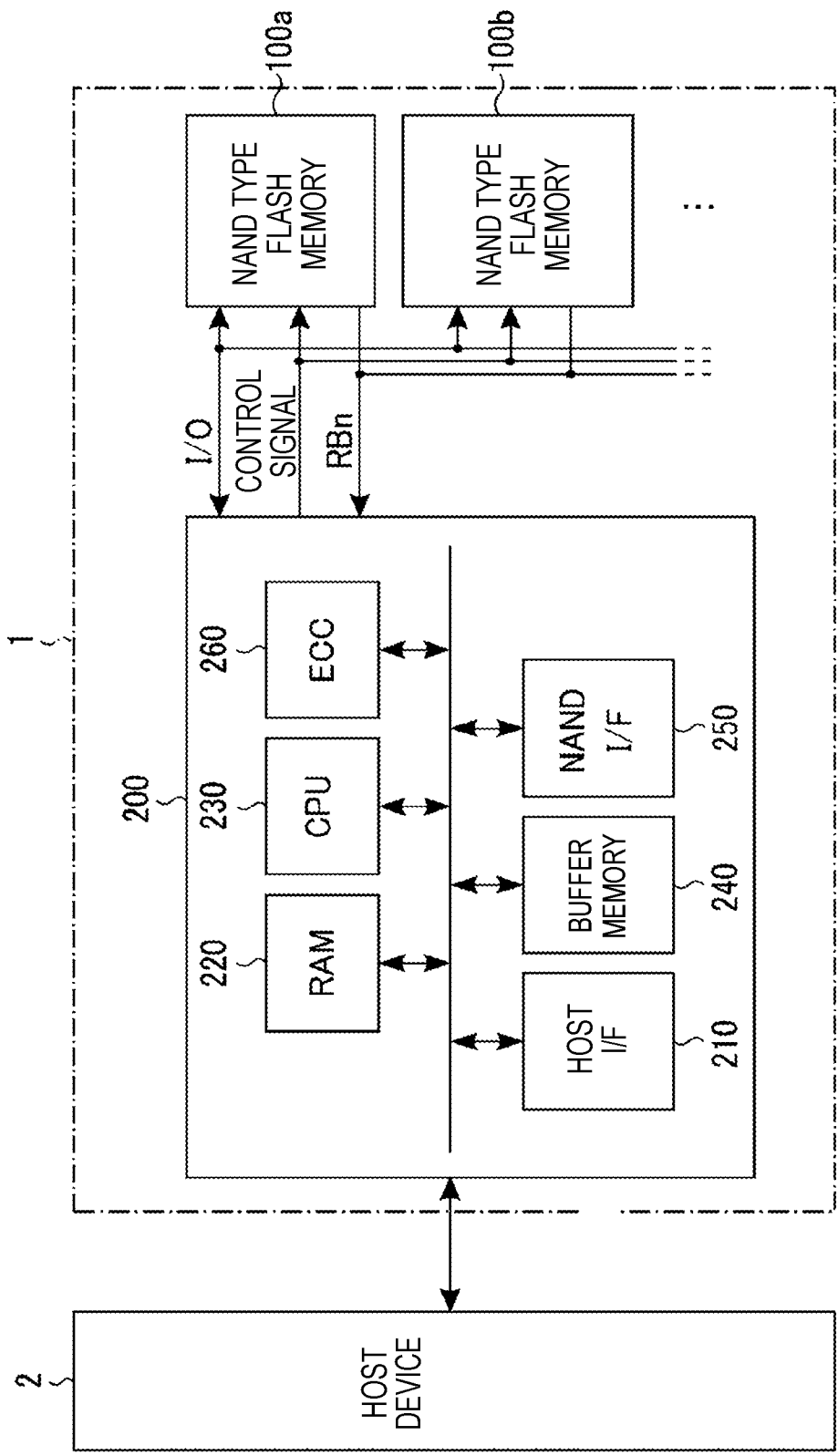
FIG. 1 is a block diagram of a memory system including a semiconductor memory device according to a first embodiment.

Embodiments provide a semiconductor memory device that includes a first plane and a second plane each including a memory cell array that includes a plurality of memory cells, a control circuit configured to perform a write operation on the memory cells to store at least first and second bits per memory cell, and to perform a first read operation using a first read voltage to read the first bits from the memory cells, and to perform a second read operation using second and third read voltages to read the second bits from the memory cells, and an input/output circuit in which data read from the memory cells are stored. In response to a first read instruction instructing reading of the first bits from an external controller, the control circuit performs the first read operation to read the first bits from the first plane and the second read operation to read the second bits from the second plane, and the input/output circuit outputs the first bits read from the first plane and then the second bits read from the second plane. In response to a second read instruction instructing reading of the second bits from the external controller, the control circuit performs the second read operation to read the second bits from the first plane and performs the first read operation to read the first bits from the second plane, and the input/output circuit outputs the first bits read from the second plane and then the second bits read from the first plane.

In general, according to one embodiment, it is possible to provide a semiconductor memory device capable of improving processing speed.

Hereinafter, embodiments will be described with reference to the accompanying drawings. In the following description, elements having substantially the same functions and configurations are denoted by the same reference numerals. Further, the embodiments described below provide examples of an apparatus and a method for embodying the technical idea thereof, and the technical idea of the embodiments are not limited to the material, shape, structure, arrangement, and the like of the components of the embodiments. The technical ideas of the embodiments may be modified in various ways within the scope of the claims.

1. First Embodiment

The semiconductor memory device according to a first embodiment will be described. Hereinafter, as a semiconductor memory device, a three-dimensional stacked NAND-type flash memory in which memory cell transistors are stacked above a semiconductor substrate will be described as an example.

1.1 Configuration 1.1.1 Configuration of Memory System

First, the overall configuration of a memory system 1 will be described with reference to FIG. 1.

As illustrated in FIG. 1, the memory system 1 includes plural semiconductor memory devices 100 (100*a*, 100*b*, . . . ) and a controller 200, and is connected to an external host device 2. Hereinafter, when none of the semiconductor memory devices 100*a*, 100*b*, . . . is specified in particular, such an element is described as the semiconductor memory device 100. The controller 200 and the semiconductor memory device 100 may form one semiconductor memory device by, for example, a combination thereof, and examples thereof include a memory card such as an SD™ card, a solid state drive (SSD), and the like.

The semiconductor memory device 100 is a non-volatile memory capable of storing data in a non-volatile manner. Each of the plural semiconductor memory devices 100 may operate independently. Further, the number of the semiconductor memory devices 100 provided in the memory system 1 is any number, and may be one or more.

In response to a request (or instruction) from the host device 2, the controller 200 instructs the semiconductor memory device 100 to execute a read operation, a write operation, an erase operation, and the like. The respective functions of the controller 200 may be implemented by a dedicated circuit or may be implemented by a processor that executes firmware. In the present embodiment, descriptions will be made on a case where a dedicated circuit is provided in the controller 200.

The controller 200 includes a host interface circuit 210, a built-in memory (RAM) 220, a processor (e.g., CPU; central processing unit) 230, a buffer memory 240, a NAND interface circuit 250, and an ECC circuit 260.

The host interface circuit 210 is connected to the host device 2 by a host bus and is in charge of communication with the host device 2. For example, the host interface circuit 210 transfers the instructions and data received from the host device 2 to the CPU 230 and the buffer memory 240, respectively. The host interface circuit 210 also transfers data or the like in the buffer memory 240 to the host device 2 in response to an instruction of the CPU 230.

The RAM 220 is, for example, a semiconductor memory such as a DRAM, and stores firmware used to manage the semiconductor memory device 100, various management tables, and the like. In addition, the RAM 220 is used as a work area of the CPU 230.

The CPU 230 controls the overall operation of the controller 200. For example, the CPU 230 issues a write command in response to the write instruction received from the host device 2, and transmits the issued write command to the NAND interface circuit 250. This operation is the same for read and erase instructions. The CPU 230 also executes various processes to manage the memory space of the semiconductor memory device 100, such as wear leveling.

The buffer memory 240 temporarily stores read data received by the controller 200 from the semiconductor memory device 100 and write data received from the host device 2, and the like.

The ECC circuit 260 performs a data error checking and correcting (ECC) process. Specifically, the ECC circuit 260 generates parity based on write data at the time of data write operation. The ECC circuit 260 then generates a syndrome from the parity at the time of data read operation, detects an error, and corrects the detected error.

The NAND interface circuit 250 is connected to the semiconductor memory device 100 by a NAND bus, and is in charge of communication with the semiconductor memory device 100. For example, the NAND interface circuit 250 transmits various control signals to the semiconductor memory device 100 based on the instruction received from the CPU 230. The NAND interface circuit 250 transmits a ready/busy signal RBn received from the semiconductor memory device 100 to the CPU 230. In addition, the NAND interface circuit 250 exchanges the signal I/O with the semiconductor memory device 100.

The ready/busy signal RBn is a signal for notifying the controller 200 whether the semiconductor memory device 100 is in a state of capable of receiving an instruction from the controller 200. For example, the ready/busy signal RBn is set to a high ("H") level when the semiconductor memory device 100 is in a state of capable of receiving the instruction from the controller 200 (ready state), and is set to a low ("L") level when the semiconductor memory device 100 is in a state of not capable of receiving the instruction from the controller 200 (busy state).

The signal I/O is, for example, an 8-bit signal and includes a command, an address, data, and the like. More specifically, for example, in a write operation, the signal I/O transferred to the semiconductor memory device 100 includes a write command issued by the CPU 230, a logical address, and write data in the buffer memory 240. Further, in a read operation, the signal I/O transferred to the semiconductor memory device 100 includes a read command and a logical address issued by the CPU 230, and the signal I/O transferred to the controller 200 includes read data.

1.1.2 Configuration of Semiconductor Memory Device

Figure 2:
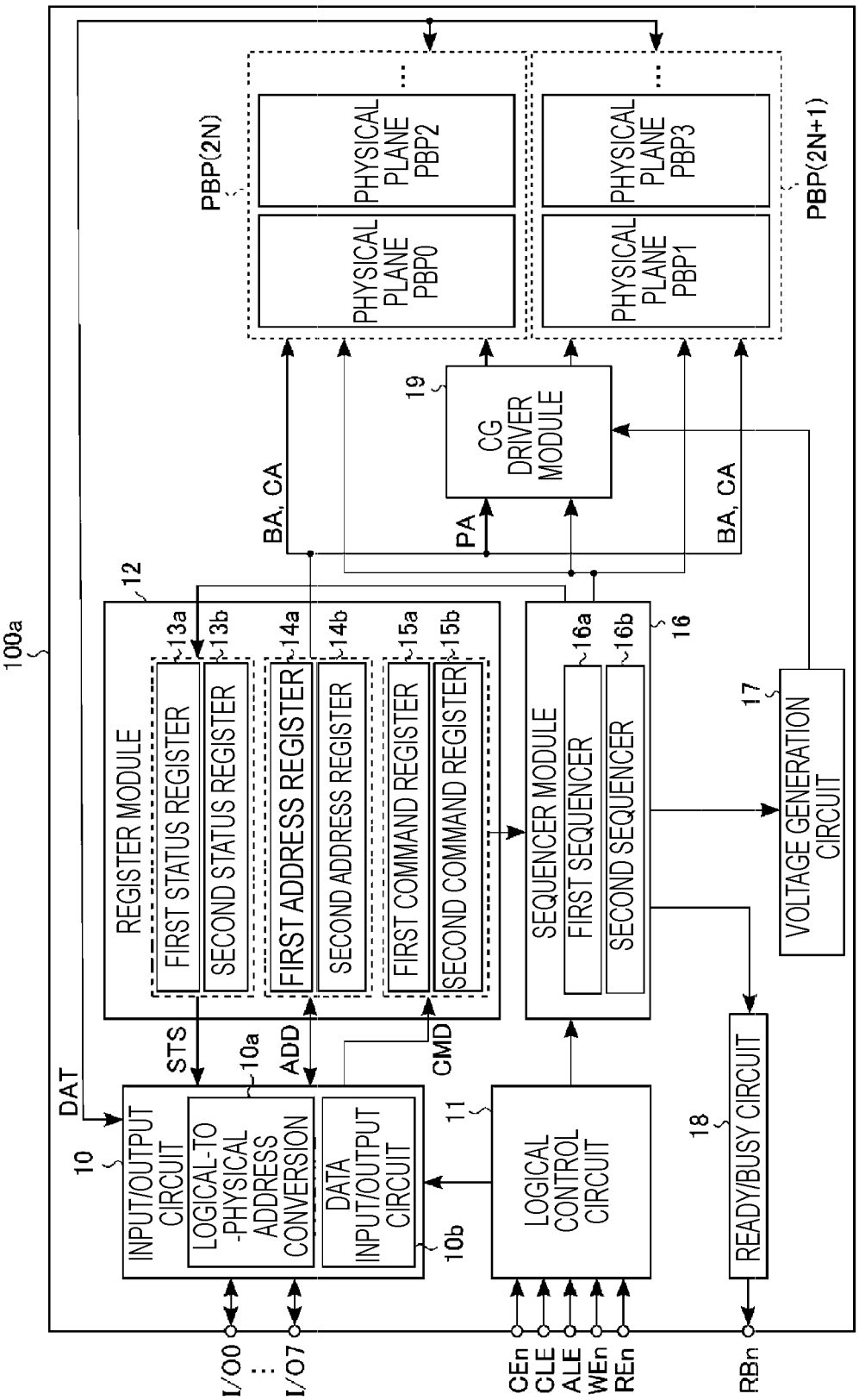
FIG. 2 is a block diagram of the semiconductor memory device according to the first embodiment.

Next, the configuration of the semiconductor memory device 100 will be described with reference to FIG. 2. Further, although the semiconductor memory device 100*a* is illustrated in the example of FIG. 2, the same is applicable to the other semiconductor memory device 100. In addition, although a part of the connection between respective blocks is represented by an arrow line, the connection between the respective blocks is not limited to this.

As illustrated in FIG. 2, the semiconductor memory device 100 includes, for example, an even number of plural physical planes PBP (PBP0, PBP1, PBP2, PBP3, . . . ), an input/output circuit 10, a logical control circuit 11, a register module 12, a sequencer module 16, a voltage generation circuit 17, a ready/busy circuit 18, and a CG driver module 19.

The physical plane PBP executes a write operation, a read operation, an erase operation, and the like in the unit of blocks (not illustrated) including plural memory cell transistors (not illustrated). Each physical plane PBP has a similar configuration.

In the present embodiment, the semiconductor memory device 100 includes two or more even number of physical planes PBP. Hereinafter, the even-numbered physical plane PBP (PBP0, PBP2, . . . ) is also described as a physical plane PBP (2N), and the odd-numbered physical plane PBP (PBP1, PBP3, . . . ) is also described as a physical plane PBP (2N+1). A variable N is an integer number greater than or equal to 0 and indicates the number of the logical plane PBL. The logical plane PBL is a unit of control for the write operation, the read operation, the erase operation, and the like in the host device 2 and the controller 200. In the semiconductor memory device 100, two physical planes PBP (2N) and PBP (2N+1) correspond to the Nth logical plane PBL (N). For example, the memory capacity in the logical plane PBL (N) is equal to the sum of the memory capacities of the physical plane PBP (2N) and the physical plane PBP (2N+1).

In the present embodiment, when a write instruction or a read instruction corresponding to one logical plane PBL (N) is received from the controller 200, the semiconductor memory device 100 executes a write operation or a read operation using two physical planes PBP (2N) and PBP (2N+1). More specifically, for example, when a write instruction of write data of data length 2X (X is any integer)

in the logical plane PBL0 (N=0) is received from the controller 200, the semiconductor memory device 100 divides the data into two pieces and writes data of data length X in two physical planes PBP0 and PBP1, respectively. Similarly, for example, when a read instruction in the logical plane PBL1 (N=1) is received from the controller 200, the semiconductor memory device 100 reads data having data length X from the two physical planes PBP2 and PBP3, respectively, and transmits the read data having data length 2X in total to the controller 200.

The input/output circuit 10 controls, for example, the input/output of 8-bit signals I/O 0 to I/O 7 (hereinafter, also referred to as I/O [7:0]). The input/output circuit 10 includes a logical-to-physical address conversion module 10a and a data input/output circuit 10b.

When a logical address ADD and a logical command CMD corresponding to the logical plane PBL (N) are received from the controller 200, the logical-to-physical address conversion module 10a converts the logical address ADD and the logical command CMD into a physical address ADD and a physical command CMD corresponding to the physical planes PBP (2N) and PBP (2N+1), respectively, and transmits the converted elements to the register module 12.

Further, when physical status information STS corresponding to the physical planes PBP (2N) and PBP (2N+1) is received from the register module 12, the logical-to-physical address module 10a converts the physical status information STS into the logical status information STS corresponding to the logical plane PBL (N), and transmits the converted element to the controller 200. The status information STS includes, for example, information used to notify the controller 200 whether the operation has ended normally.

Hereinafter, in a logical-to-physical address conversion circuit 31, an operation of converting the logical address ADD into the physical address ADD, an operation of converting the logical command CMD into the physical command CMD, or an operation of converting the physical status information STS into the logical status information STS is described as a logical-to-physical address conversion operation.

When write data DAT (data length 2X) corresponding to the logical plane PBL (N) is received from the controller 200 in the write operation, the data input/output circuit 10b divides such data into two data pieces each having data length X, and transmits the divided data to the two physical planes PBP (2N) and PBP (2N+1), respectively. Further, in the read operation, the data input/output circuit 10b uses two pieces of read data DAT having data length X that is read by the two physical planes PBP (2N) and PB (2N+1), as one data having data length 2X, and continuously transmits such read data to the controller 200.

The logical control circuit 11 receives a control signal from the controller 200. Examples of the control signal include a chip enable signal CEn, a command latch enable signal CLE, an address latch enable signal ALE, a write enable signal WEn, and a read enable signal REn. Also, the logical control circuit 11 controls the input/output circuit 10 and the sequencer module 16 in accordance with the received signal.

The chip enable signal CEn is a signal that enables the semiconductor memory device 100, and is asserted at, for example, the "L" level. The command latch enable signal CLE is a signal indicating that the signal I/O is a command CMD, and is asserted at, for example, the "H" level. The address latch enable signal ALE is a signal indicating that the signal I/O is the address ADD, and is asserted at, for example, the "H" level. The write enable signal WEn is a signal that indicates that the signal I/O is an input signal that is input into the semiconductor memory device 100, and is asserted at, for example, the "L" level every time the command CMD, the address ADD, the data DAT, and the like are received from the controller 200. Thus, the signal I/O is input into the semiconductor memory device 100 every time the WEn is toggled. The read enable signal REn is a signal indicating to the controller 200 that read data DAT is output from the semiconductor memory device 100 through the signal I/O. The read enable signal REn is asserted at, for example, the "L" level.

The register module 12 includes a first status register 13a, a second status register 13b, a first address register 14a, a second address register 14b, a first command register 15a, and a second command register 15b.

The first status register 13a temporarily stores the first physical status information STS received from the sequencer module 16 during, for example, a write operation, a read operation, an erase operation, and the like performed on the physical plane PBP (2N). Then, the first physical status information STS stored in the first status register 13a is transferred to the input/output circuit 10.

The second status register 13b temporarily stores the second physical status information STS received from the sequencer module 16 during, for example, a write operation, a read operation, an erase operation, and the like performed on the physical plane PBP (2N+1). Then, the second physical status information STS stored in the second status register 13b is transferred to the input/output circuit 10.

The first address register 14a temporarily stores, for example, a first physical address ADD corresponding to a physical plane PBP (2N), received from the input/output circuit 10. The first physical address ADD includes, for example, a plane address PA, a block address BA, and a column address CA. The plane address PA is transferred from the first address register 14a to the CG driver module 19, and the block address BA and the column address CA are transferred from the first address register 14a to the corresponding physical plane PBP (2N).

The second address register 14b temporarily stores, for example, a second physical address ADD corresponding to the physical plane PBP (2N+1), which is received from the input/output circuit 10. The second physical address ADD includes, for example, the plane address PA, the block address BA, and the column address CA. The plane address PA is transferred from the first address register 14b to the CG driver module 19, and the block address BA and the column address CA are transferred from the first address register 14b to the corresponding physical plane PBP (2N+1).

The first command register 15a temporarily stores a first physical command CMD that is received from the input/output circuit 10 and corresponds to, for example, the physical plane PBP (2N). The first physical command CMD is transferred from the first command register 15a to the sequencer module 16.

The second command register 15b temporarily stores a second physical command CMD that is received from the input/output circuit 10 and corresponds to, for example, the physical plane PBP (2N+1). The second physical command CMD is transferred from the second command register 15b to the sequencer module 16.

The sequencer module 16 controls the overall operation of the semiconductor memory device 100 in accordance with a write instruction, a read instruction, an erase instruction, and the like received from controller 200. The sequencer module 16 includes a first sequencer 16a and a second sequencer 16b.

The first sequencer 16a controls, for example, the first status register 13a, the ready/busy circuit 18, the voltage generation circuit 17, the CG driver module 19, the physical plane PBP (2N), and the like in accordance with the first physical command CMD stored in the first command register 15a so as to execute a write operation, a read operation, an erase operation, and the like on the physical plane PBP (2N).

The second sequencer 16b controls, for example, the second status register 13b, the ready/busy circuit 18, the voltage generation circuit 17, the CG driver module 19, the physical plane PBP (2N+1), and the like in accordance with the second physical command CMD stored in the second command register 15b so as to execute a write operation, a read operation, an erase operation, and the like on the physical plane PBP (2N+1).

The voltage generation circuit 17 generates voltages necessary for the write operation, the read operation, and the erase operation according to the control of the sequencer module 16, and supplies the generated voltages to, for example, the CG driver module 19, the physical plane PBP, and the like.

The ready/busy circuit 18 transmits the ready/busy signal RBn to the controller 200 according to the control of the sequencer module 16.

The CG driver module 19 applies the voltages supplied from the voltage generation circuit 17 to the corresponding physical planes PB (2N) and PB (2N+1) based on the plane address PA received from the first address register 14a and the second address register 14b.

1.1.3 Configuration of Physical Plane

Next, the configuration of the physical plane PB will be described with reference to FIG. 3. Further, although the physical plane PBP0 is illustrated in the example of FIG. 3, the other physical planes PBP have the same configuration.

Figure 3:
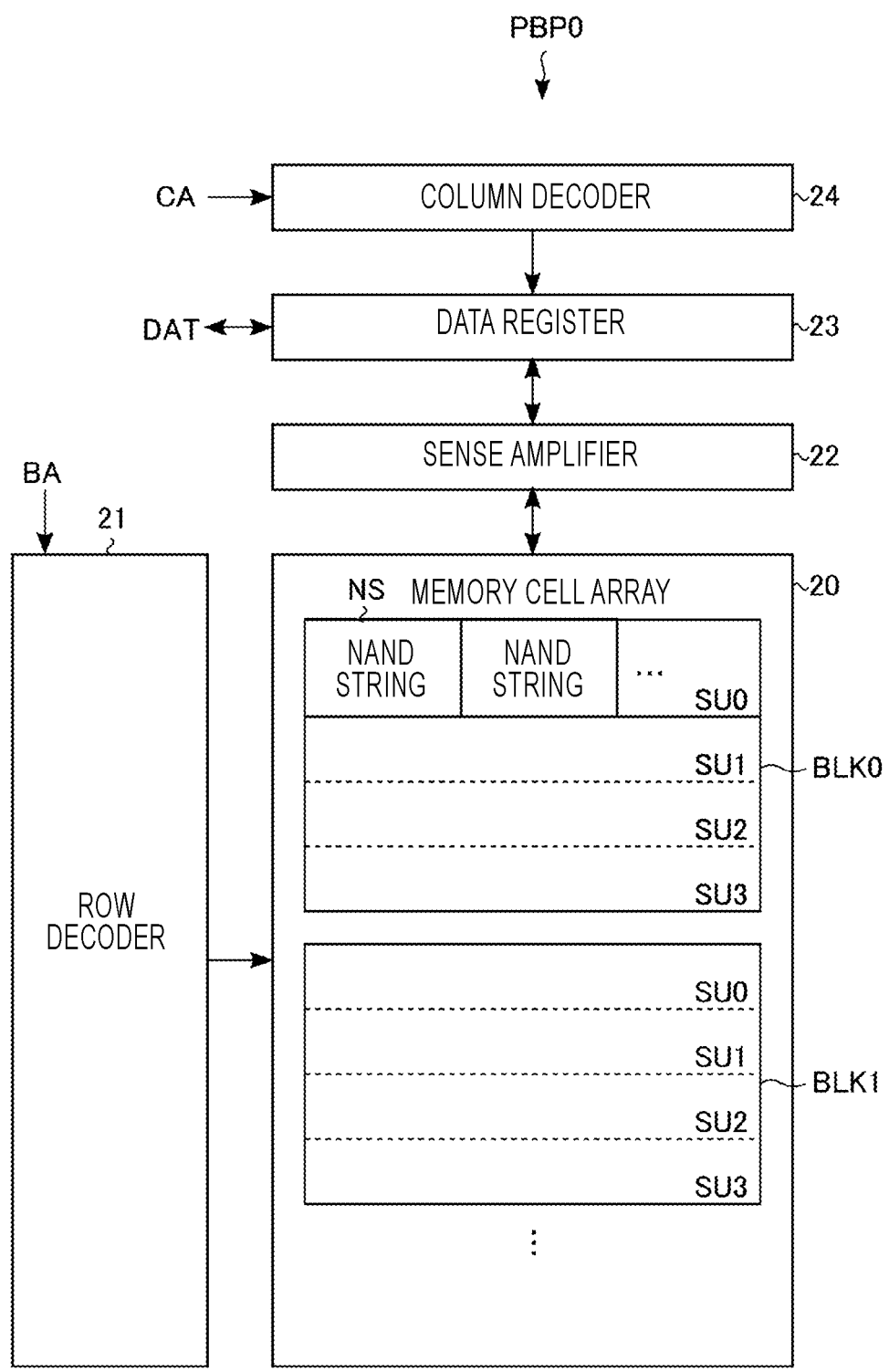
FIG. 3 is a block diagram of a plane provided in the semiconductor memory device according to the first embodiment.

As illustrated in FIG. 3, the physical plane PBP includes a memory cell array 20, a row decoder 21, a sense amplifier 22, a data register 23, and a column decoder 24.

The memory cell array 20 includes plural blocks BLK (BLK0, BLK1, . . . ) that include plural nonvolatile memory cell transistors associated with word lines and bit lines (hereinafter, also referred to as memory cells). Each of the blocks BLK is distinguished by, for example, mutually identifiable block addresses BA.

The block BLK is, for example, a unit of data erasure, and data in the same block BLK is erased collectively. Each block BLK includes, for example, four string units SU (SU0 to SU3). Each string unit SU includes plural NAND strings NS. Further, the number of blocks BLK in the memory cell array 20, the number of string units SU in one block BLK, and the number of NAND strings NS in one string unit SU may be any number.

The row decoder 21 is connected to a wiring arranged in the row direction in each block BLK (e.g., a word line and a select gate line). The row decoder 21 applies voltages necessary for the write operation, the read operation, and the erase operation to the wiring of the block BLK selected based on the block address BA.

The sense amplifier 22 performs a sense operation on the memory cell array 20 in the read operation to read data from the memory cell array 20. Then, the sense amplifier 22 transmits the read data to the data register 23. Further, the sense amplifier 22 performs a program operation on the memory cell array 20 according to the write data received from the data register in the write operation.

The data register 23 includes plural latch circuits. The latch circuit stores write data and read data. For example, in the write operation, the data register 23 temporarily stores the write data received from the input/output circuit 10 and transmits the write data to the sense amplifier 22. Also, for example, in the read operation, the data register 23 temporarily stores read data received from the sense amplifier 22 and transmits the read data to the input/output circuit 10.

The column decoder 24 decodes the column address CA in, for example, the write operation, the read operation, and the erase operation, and selects a latch circuit in the data register 23 according to the decoding result.

1.1.4 Circuit Configuration of Memory Cell Array

Next, the circuit configuration of the memory cell array 20 will be described with reference to FIG. 4. Although the circuit diagram of the block BLK0 is illustrated in the example of FIG. 4, the other blocks BLK also have the same configuration.

Figure 4:
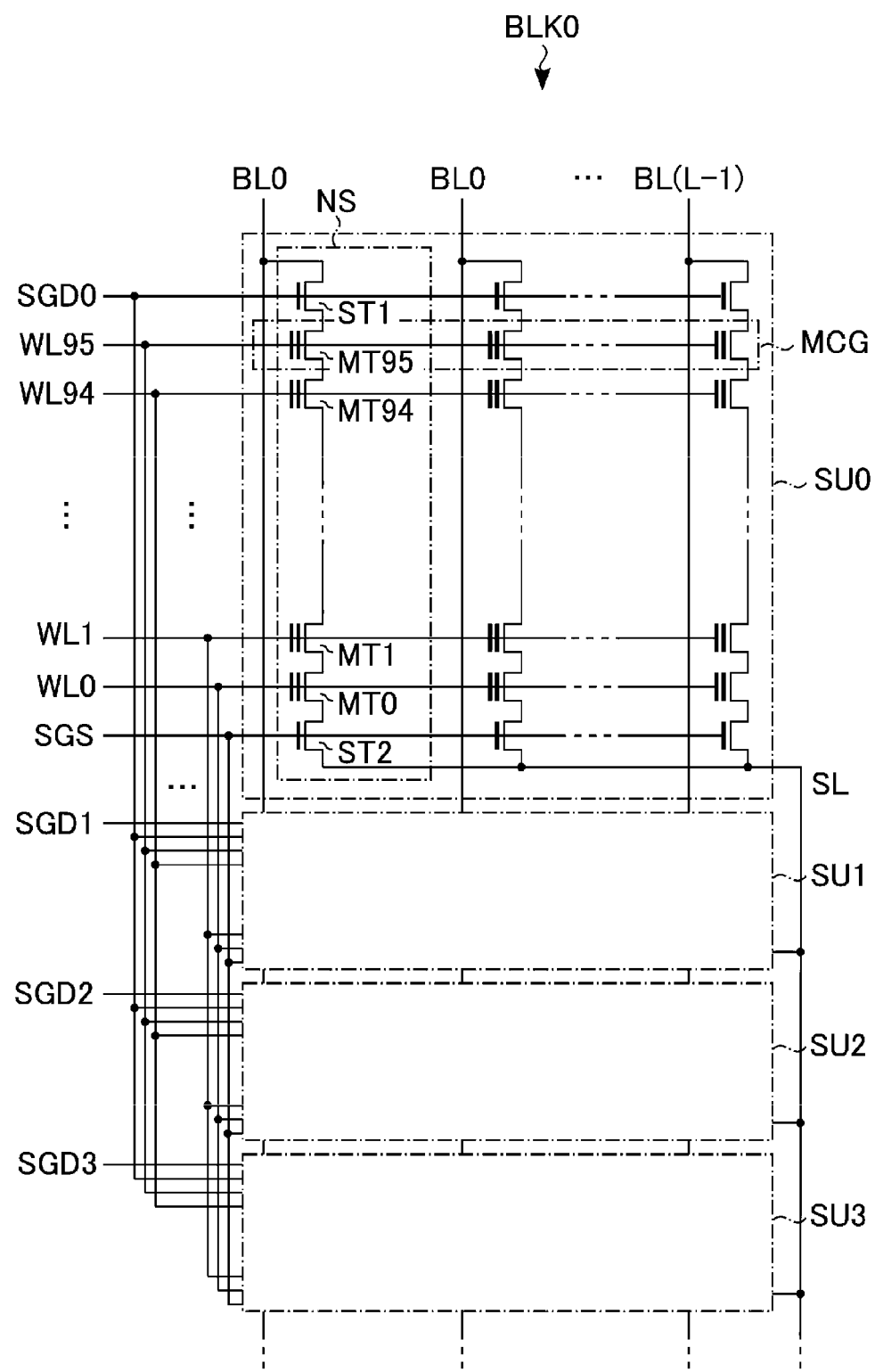
FIG. 4 is a circuit diagram of a memory cell array provided in the semiconductor memory device according to the first embodiment.

As illustrated in FIG. 4, the block BLK0 includes, for example, four string units SU (SU0 to SU3). Each string unit SU includes plural NAND strings NS. Each of the NAND strings NS includes, for example, 96 memory cell transistors MT0 to MT95, and select transistors ST1 and ST2. Hereinafter, when one of the memory cell transistors MT0 to MT95 is not distinguished from the others, such a memory cell transistor is referred to as a memory cell transistor MT. The memory cell transistor MT includes a control gate and a charge storage layer, and stores data in a non-volatile manner.

Further, the memory cell transistor MT may be a MONOS type using an insulating film as a charge storage layer, or may be an FG type using a conductive layer as a charge storage layer. Further, the number of memory cell transistors MT is not limited to 96 and may be 8, 16, 32, 48, 64, 128, or the like, and the number thereof is not limited. Furthermore, the number of select transistors ST1 and ST2 is any number, and may be more than or equal to one.

The memory cell transistors MT in one NAND string NS are connected in series between the source of the select transistor ST1 and the drain of the select transistor ST2. More specifically, the current paths of the memory cell transistors MT0 to MT95 are connected in series. The drain of the memory cell transistor MT95 is connected to the source of the select transistor ST1, and the source of the memory cell transistor MT0 is connected to the drain of the select transistor ST2.

The gate of the select transistor ST1 in each of the string units SU0 to SU3 is connected to the row decoder 21 via select gate lines SGD0 to SGD3, respectively. Hereinafter, when one of the select gate lines SGD0 to SGD3 is not distinguished from the others, such a select gate line is referred to as a select gate line SGD.

The gate of the select transistor ST2 in each of the string units SU0 to SU3 is connected to the row decoder 21 via one select gate line SGS. Alternatively, the gate of the select transistor ST2 in each of the string units SU0 to SU3 may be connected to the row decoder 21 via select gate lines SGS0 to SGS3, respectively.

The control gates of the memory cell transistors MT0 to MT95 in the block BLK are connected to word lines WL0 to WL95, respectively. The word lines WL0 to WL95 are connected to the row decoder 21. Hereinafter, when one or more of the word lines WL0 to WL95 are not distinguished from the others, such a word line is referred to as a word lines WL or such word lines are referred to as word lines WL.

The drain of the select transistor ST1 of each of the NAND strings NS in the string unit SU is connected to different bit lines BL0 to BL (L−1) (L is an integer more than or equal to 2). Hereinafter, when one of the bit lines BL0 to BL (L−1) is not distinguished from the others, such a bit line is referred to as a bit line BL. Each of the bit lines BL is connected to the sense amplifier 22. Each bit line BL is commonly connected to one NAND string NS in each of the string units SU across plural blocks BLK.

The sources of the plural select transistors ST2 of the plural blocks BLK are commonly connected to the source line SL.

The string unit SU is an aggregate of NAND strings NS that are connected to different bit lines BL and connected to the same select gate line SGD. Further, the block BLK is an aggregate of plural string units SU which share the word line WL. In addition, the memory cell array 20 is an aggregate of plural blocks BLK which share the bit line BL.

The write operation and the read operation are collectively performed on the memory cell transistors MT connected to any one word line WL in any one string unit SU. Hereinafter, a group of memory cell transistors MT collectively selected in the write operation and the read operation is referred to as a "memory cell group MCG." Then, in one memory cell group MCG, a group of 1-bit data that is written to or read from each of the memory cell transistors MT is referred to as a "page." Therefore, when 2-bit data is stored in one memory cell transistor MT, data of 2 pages is stored in the memory cell group MCG connected to one word line WL. In the following description, a case where one memory cell transistor MT may store 2-bit data will be described.

In the present embodiment, one page in the logical plane PBL (N) is composed of two pages in the physical plane PBP, that is, one page in the physical plane PBP (2N) and one page in the physical plane PBP (2N+1). In the following, to simplify explanation, descriptions will be made on a case where the number of blocks BLK, the number of string units SU, and the number of word lines WL in the logical plane PBL are the same as the number of blocks BLK, the number of string units SU, and the number of word lines WL in the physical plane PBP, and the number of bit lines BL in the logical plane PBL (i.e., data length) is twice the number of bit lines BL in the physical plane PBP.

Further, when the number of bits of data that the memory cell transistors MT may store is not limited to two bits, but two or more bits, this embodiment may be applied thereto.

In addition, the configuration of the memory cell array 20 may be of another configuration, such as the configurations described in, for example, U.S. patent application Ser. No. 12/407,403, filed on Mar. 19, 2009, entitled "THREE-DIMENSIONAL STACKED NONVOLATILE SEMICONDUCTOR MEMORY," U.S. patent application Ser. No. 12/406,524, filed on Mar. 18, 2009, entitled "THREE-DIMENSIONAL STACKED NONVOLATILE SEMICONDUCTOR MEMORY," U.S. patent application Ser. No. 12/679,991, filed on Mar. 25, 2010, entitled "NON-VOLATILE SEMICONDUCTOR STORAGE DEVICE AND METHOD OF MANUFACTURING THE SAME," and U.S. patent application Ser. No. 12/532,030, filed on Mar. 23, 2009, entitled "SEMICONDUCTOR MEMORY AND METHOD FOR MANUFACTURING SAME." All of these patent applications are hereby incorporated by reference in their entirety.

1.1.5 Configuration of Logical-to-Physical Address Conversion Module

Next, the configuration of the logical-to-physical address conversion module 10a will be described with reference to FIG. 5.

Figure 5:
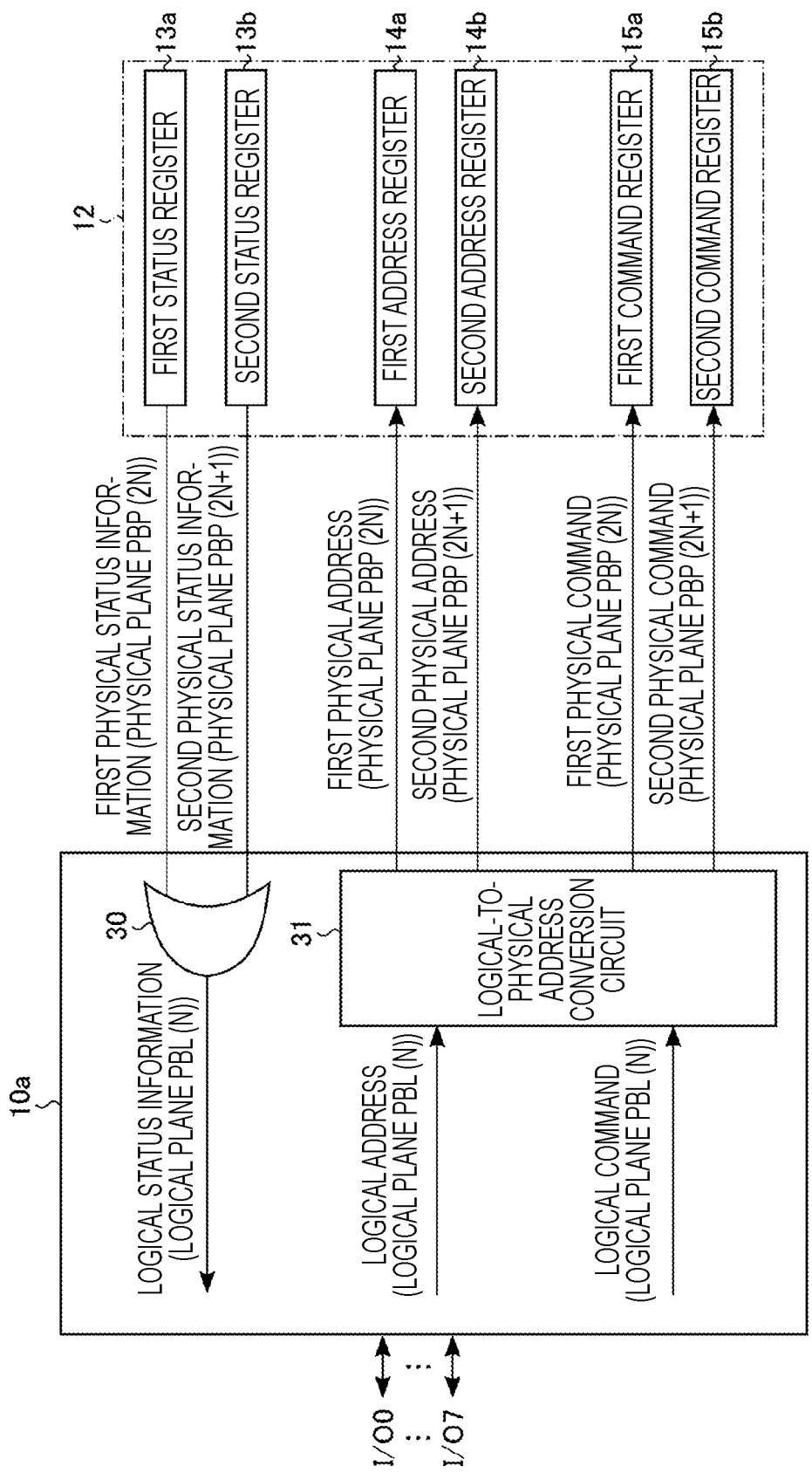
FIG. 5 is a block diagram illustrating a connection between an input/output circuit and a register provided in the semiconductor memory device according to the first embodiment.

As illustrated in FIG. 5, the logical-to-physical address conversion module 10a includes a logical sum (OR) circuit 30 and a logical-to-physical address conversion circuit 31.

A first input terminal of the OR circuit 30 is connected to the first status register 13a, and a second input terminal thereof is connected to the second status register 13b. The OR circuit 30 performs an OR operation on the first physical status information STS corresponding to the physical plane PBP (2N) received from the first status register 13a and the second physical status information STS corresponding to the physical plane PBP (2N+1), and outputs the result as the logical status information STS corresponding to the logical plane PBL (N).

More specifically, for example, when the operation ends normally in one physical plane PBP, the physical status information is set to the "L" level, and when the operation does not end normally, the physical status information is set to the "H" level. Then, for example, when the operation ends normally in the physical planes PBP (2N) and PBP (2N+1), the first and second physical status information STS is set to the "L" level. In this case, the OR circuit 30 outputs the logical status information STS at the "L" level.

Also, for example, when the operation ends normally in the physical plane PBP (2N) and the operation does not end normally in the physical plane PBP (2N+1), the first physical status information STS is set to the "L" level and the second physical status information STS is set to the "H" level. In this case, the OR circuit 30 outputs the logical status information STS of the "H" level.

Also, for example, when the operation does not end normally in the physical planes PBP (2N) and PBP (2N+1), the first and second physical status information STS is set to the "H" level. In this case, the OR circuit 30 outputs the logical status information STS of the "H" level.

The logical-to-physical address conversion circuit 31 converts the logical address ADD that is received from the controller 200 and corresponds to the logical plane PBL (N) into the first physical address ADD corresponding to the physical plane PBP (2N) and the second physical address ADD corresponding to the physical plane PBP (2N+1), and transmits the converted logical address ADD to the first address register 14a and the second address register 14b, respectively. The logical-to-physical address conversion circuit 31 also converts the logical command CMD that is received from the controller 200 and corresponds to the logical plane PBL (N) into the first physical command CMD corresponding to the physical plane PBP (2N) and the second physical command CMD corresponding to the physical plane PBP (2N+1), and transmits the converted logical command CMD to the first command register 15a and the second command register 15b, respectively.

1.1.6 Configuration of Data Input/Output Circuit

Next, the configuration of the data input/output circuit 10b will be described with reference to FIG. 6.

Figure 6:
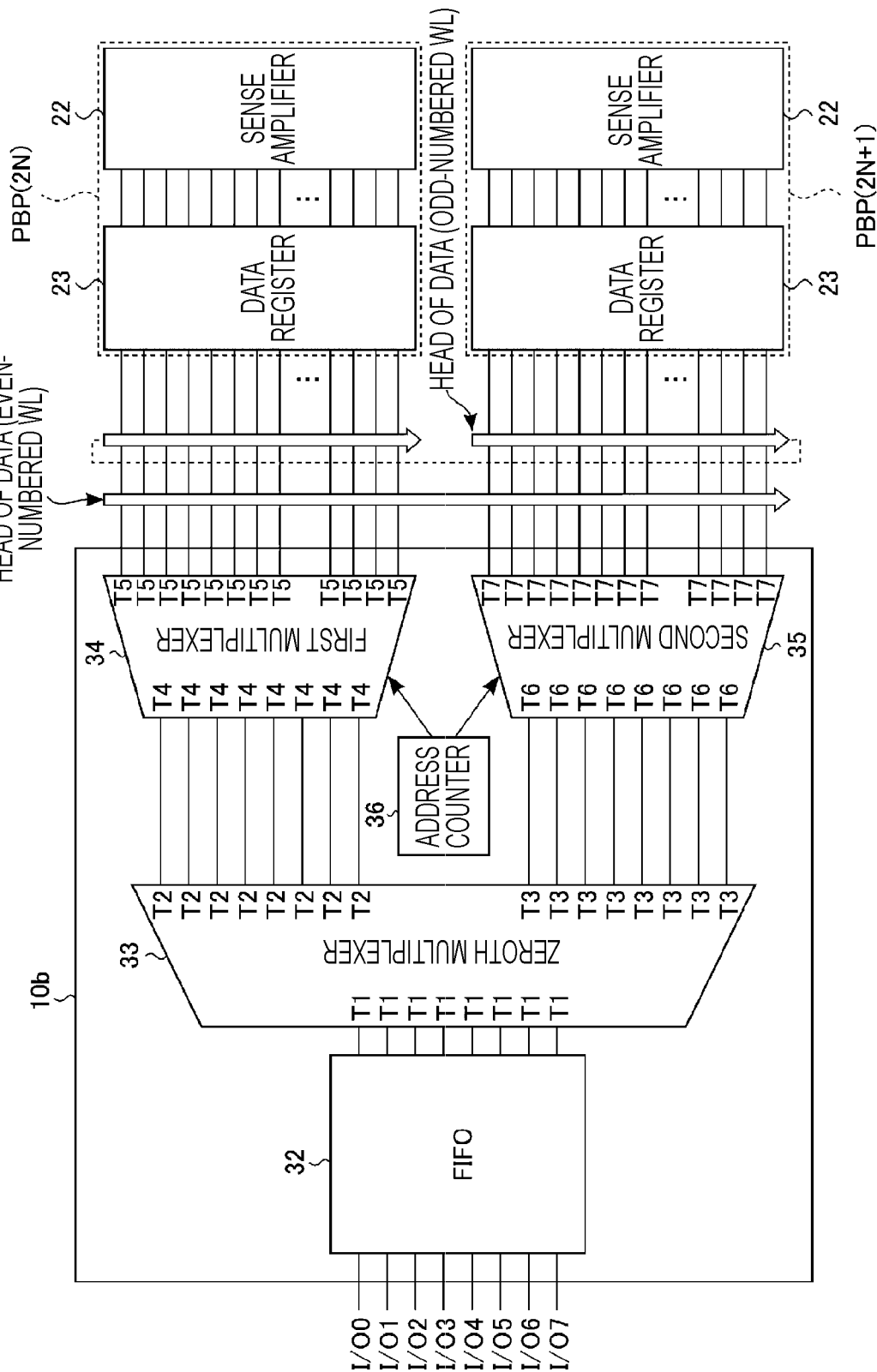
FIG. 6 is a block diagram illustrating a connection between the input/output circuit and a plane provided in the semiconductor memory device according to the first embodiment.

As illustrated in FIG. 6, the data input/output circuit 10b includes a buffer circuit 32 of a first in first out (FIFO) type (hereinafter, referred to as a "FIFO"), a zeroth multiplexer 33, a first multiplexer 34, a second multiplexer 35, and an address counter 36.

When the signal I/O [7:0] received from the controller 200 is the data DAT, the FIFO 32 sequentially transmits the signal I/O [7:0] to the zeroth multiplexer 33. Further, the FIFO 32 sequentially outputs the data DAT received from the zeroth multiplexer 33 as the signal I/O [7:0].

The FIFO 32 includes, for example, eight shift register units (not illustrated) corresponding to the signal I/O [7:0]. For example, each shift register unit includes plural flip-flops connected in series, and sequentially outputs input data according to an internal clock signal.

The zeroth multiplexer 33 has eight input/output terminals T1, eight input/output terminals T2, and eight input/output terminals T3. The eight input/output terminals T1 of the zeroth multiplexer 33 are connected to the FIFO 32 via eight signal lines, respectively. The eight input/output terminals T2 of the zeroth multiplexer 33 are connected to the first multiplexer 34 via eight signal lines, respectively. Further, the eight input/output terminals T3 of the zeroth multiplexer 33 are connected to the second multiplexer 35 via eight signal lines, respectively. Based on the control signal of the logical control circuit 11, the input/output terminal T1 and the input/output terminal T2 or the input/output terminal T3 are electrically connected to each other in the zeroth multiplexer 33.

The first multiplexer 34 connects the zeroth multiplexer 33 and the data register 23 in the physical plane PBP (2N) based on the control signal of the address counter 36. Further, the data register 23 is connected to the sense amplifier 22 via plural signal lines in the physical plane PBP (2N).

The first multiplexer 34 includes eight input/output terminals T4 and plural input/output terminals T5. The eight input/output terminals T4 of the first multiplexer 34 are connected to the eight input/output terminals T2 of the zeroth multiplexer 33, respectively. The plural input/output terminals T5 of the first multiplexer 34 are respectively connected to the data register 23 in the physical plane PBP (2N) via the plural signal lines. In the first multiplexer 34, the eight input/output terminals T5 are sequentially selected from the plural input/output terminals T5 based on the count number (count signal) in the address counter 36, and the selected eight input/output terminals T5 and eight input/output terminals T4, respectively, are electrically connected to each other.

The second multiplexer 35 connects the zeroth multiplexer 33 and the data register 23 in the physical plane PBP (2N+1) based on the control signal of the address counter 36. Further, the data register 23 in the physical plane PBP (2N+1) is connected to the sense amplifier 22 in the physical plane PBP (2N+1) via plural signal lines.

The second multiplexer 35 includes eight input/output terminals T6 and plural input/output terminals T7. The eight input/output terminals T6 of the second multiplexer 35 are connected to the eight input/output terminals T3 of the zeroth multiplexer 33, respectively. The plural input/output terminals T7 of the second multiplexer 35 are respectively connected to the data register 23 in the physical plane PBP (2N+1) via plural signal lines. In the second multiplexer 35, the eight input/output terminals T7 are sequentially selected from the plural input/output terminals T7 based on the count number in the address counter 36, and the selected eight input/output terminals T7 and the eight input/output terminals T6, respectively, are electrically connected to each other.

The address counter 36 counts based on the column address CA, and outputs the count number, that is, a count signal to the first multiplexer 34 and the second multiplexer 35.

In the present embodiment, for example, when data is read from the memory cell group MCG corresponding to the even-numbered word line WL, the data input/output circuit 10b outputs the data of the physical plane PBP (2N), and then outputs the data of the physical plane PBP (2N+1). More specifically, the zeroth multiplexer 33 first electrically connects the input/output terminal T1 to the input/output terminal T2. In this state, in the first multiplexer 34, the input/output terminal T4 and the input/output terminal T5 sequentially selected based on the count number received from the address counter 36 are electrically connected to each other. As a result, data of the physical plane PBP (2N) is output. Next, the zeroth multiplexer 33 electrically connects the input/output terminal T1 and the input/output terminal T3. In this state, in the second multiplexer 35, the input/output terminal T6 and the input/output terminal T7 sequentially selected based on the count number received from the address counter 36 are electrically connected to each other. As a result, data of the physical plane PBP (2N+1) is output.

Further, for example, when data is read from the memory cell group MCG corresponding to the odd-numbered word line WL, the data input/output circuit 10b outputs the data of the physical plane PBP (2N+1) and then, outputs the data of the physical plane PBP (2N).

1.2 Threshold Voltage Distribution of Memory Cell Transistor MT

Figure 7:
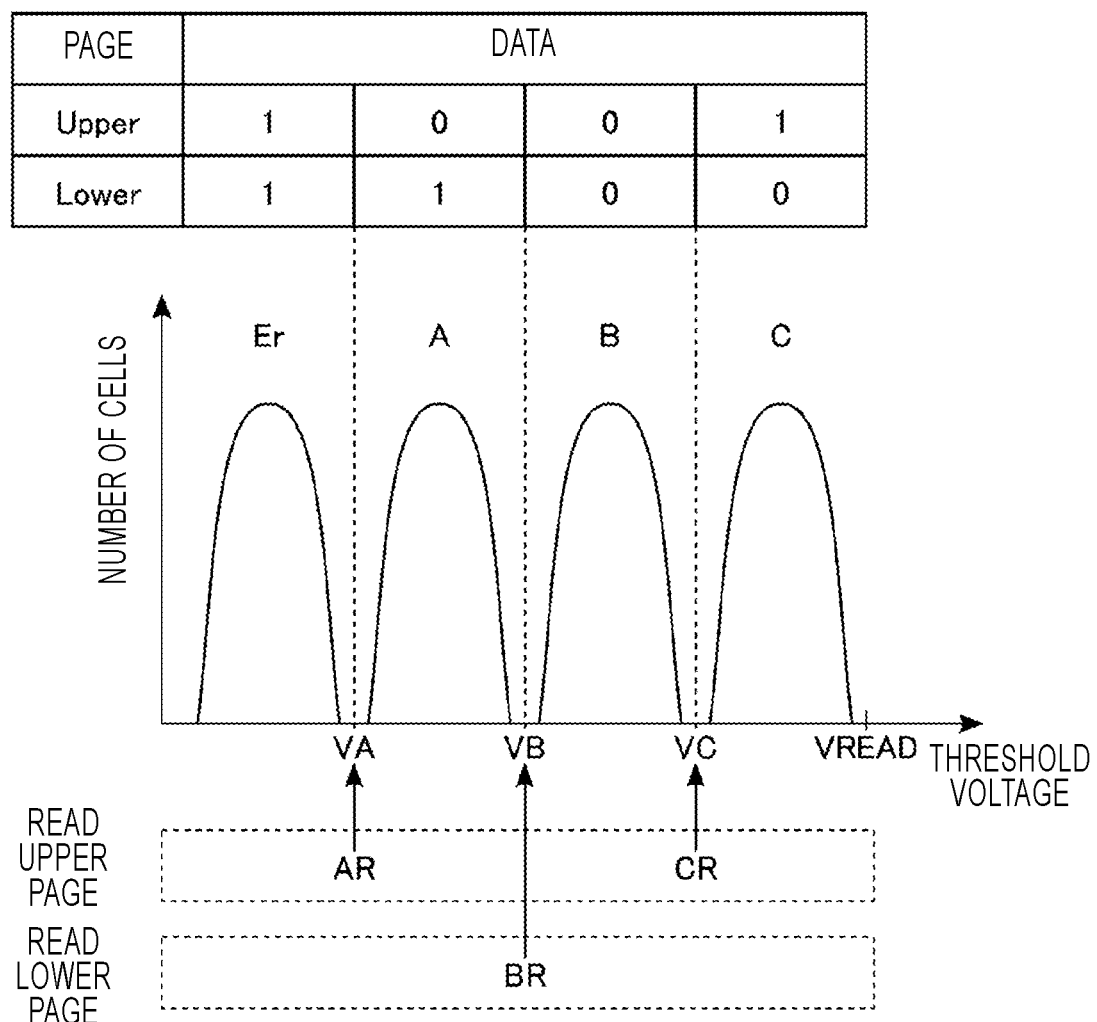
FIG. 7 is a threshold voltage distribution diagram of memory cell transistors provided in the semiconductor memory device according to the first embodiment.

Next, the threshold voltage distribution of the memory cell transistor MT will be described with reference to FIG. 7. FIG. 7 represents possible data of each memory cell transistor MT, the threshold voltage distribution, and the voltage used at the time of read operation.

As illustrated in FIG. 7, when the memory cell transistor MT stores 2-bit data, the distribution of the threshold voltage thereof is divided into four. The four threshold voltage distributions are described as an "Er" state, an "A" state, a "B" state, and a "C" state in order from the lowest threshold voltage.

Also, the voltages VA, VB, and VC illustrated in FIG. 7 are used to verify the "Er" state, the "A" state, the "B" state, and the "C" state, respectively, in the write operation. A voltage VREAD is a voltage applied to the non-selected word line WL in the read operation. When the voltage VREAD is applied to the gate (through the word line WL), the memory cell transistor MT is turned on regardless of the stored data. The relationship between these voltage values satisfies VA<VB<VC<VREAD.

The "Er" state corresponds to the erased state of the memory cell transistor MT among the above-described threshold voltage distributions. The threshold voltage at the "Er" state is less than a voltage VA. The threshold voltages of the "A" state are equal to or greater than the voltage VA and less than a voltage VB. The threshold voltages of the "B" state are equal to or greater than the voltage VB and less than a voltage VC. The threshold voltages of the "C" state are equal to or greater than the voltage VC and less than the voltage VREAD.

In the read operation in the present embodiment, in order to simplify the description, a case where the verify voltage is used as the read voltage will be described as an example. Hereinafter, the read operations using the voltages VA, VB, and VC are referred to as read operations AR, BR, and CR, respectively. The read operation AR determines whether the threshold voltage of the memory cell transistor MT is less than the voltage VA. The read operation BR determines whether the threshold voltage of the memory cell transistor MT is less than the voltage VB. The read operation CR determines whether the threshold voltage of the memory cell transistor MT is less than the voltage VC.

Further, the four threshold voltage distributions described above are formed by writing 2-bit (2-page) data including a lower bit and an upper bit. The four threshold distributions correspond to respectively different two-bit data. In the present embodiment, data is represented as "lower bit/upper bit" in the description below for the memory cell transistors MT included in each state.

The memory cell transistors MT in the "Er" state store "11" data. The memory cell transistors MT in the "A" state store "01" data. The memory cell transistors MT in the "B" state store "00" data. The memory cell transistors MT in the "C" state store "10" data. When data stored in this manner is read, the upper bit is determined by the read operations AR and CR. The lower bit is determined by the read operation BR. Therefore, the values of the upper and lower bits are determined by two read operations and one read operation, respectively.

1.3 Example of Logical-to-Physical Address Conversion Operation in Logical-to-Physical Address Conversion Circuit Next, with reference to FIG. 8, descriptions will be made on an example of the logical-to-physical address conversion operation in the logical-to-physical address conversion circuit 31. The example of FIG. 8 represents a case where the logical-to-physical address conversion operation is executed based on a command sequence which instructs a read operation of data of data length 2X.

First, the command sequence of the read operation will be described.

Figure 8:
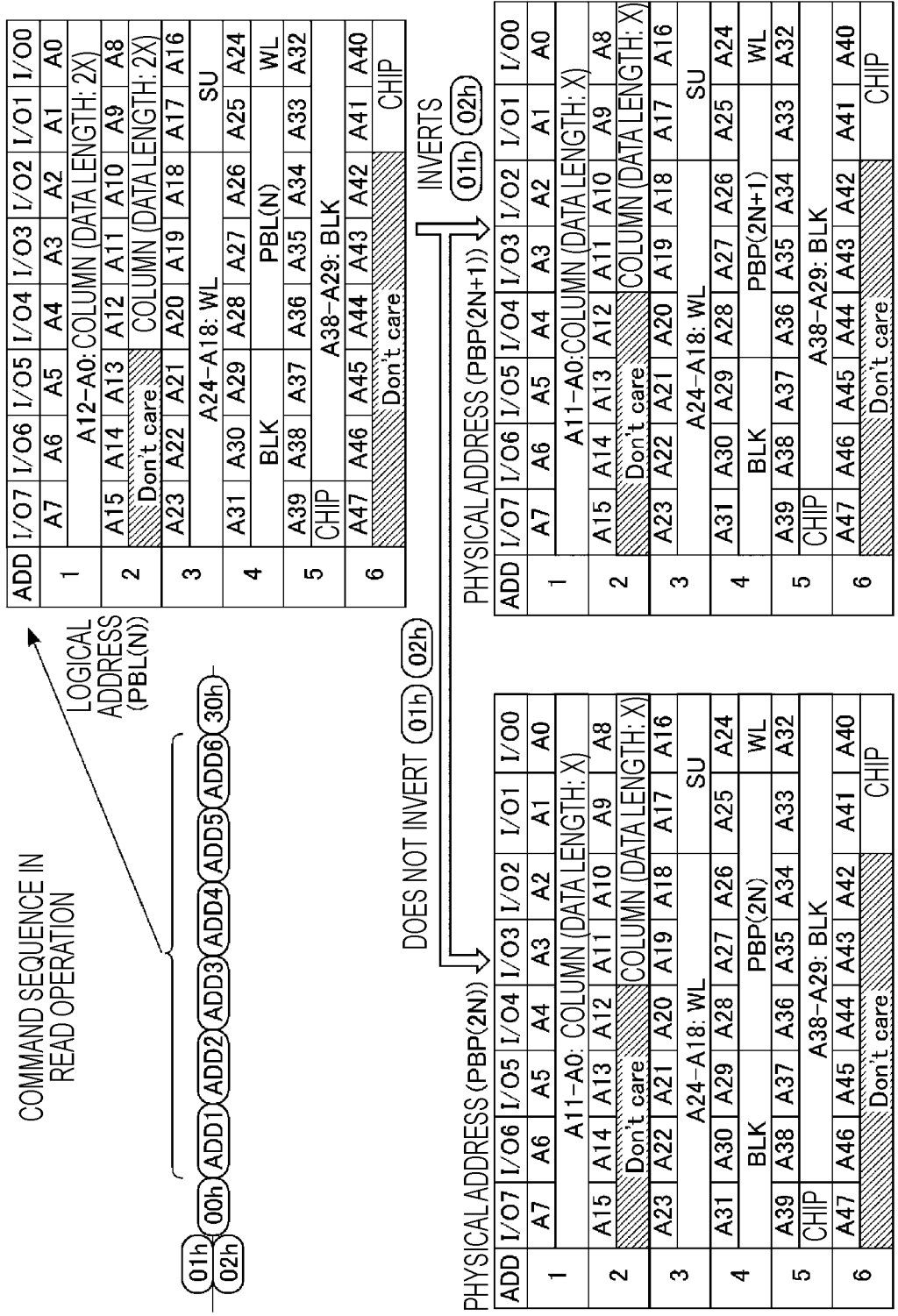
FIG. 8 is a diagram illustrating an example of logical-to-physical address conversion in a logical-to-physical address conversion circuit provided in the semiconductor memory device according to the first embodiment.

As illustrated in FIG. 8, the controller 200 first transmits, to the semiconductor memory device 100, a command "01h" which designates the lower page of the logical plane PBL (N) or a command "02h" which designates the upper page thereof.

Next, the controller 200 transmits, to the semiconductor memory device 100, a command "00h" which notifies that the read operation is to be executed.

Next, the controller 200 transmits the logical addresses "ADD1" to "ADD6" to the semiconductor memory device 100 in order. Further, although the address ADD is illustrated in six cycles in the example of FIG. 8, the number of cycles may be set according to the number of the semiconductor memory devices 100, the configuration of the memory cell array 20, the data length of one page, etc.

Next, the controller 200 transmits, to the semiconductor memory device 100, a command "30h" instructing the execution of the read operation. The semiconductor memory device 100 starts the read operation in response to the command "30h." Hereinafter, a combination of commands corresponding to the read operation is also referred to as a set of read commands.

Next, the configurations of the logical addresses "ADD1" to "ADD6" will be described.

The address ADD of one cycle includes 8-bit information corresponding to the signals I/O 0 to I/O 7. Hereinafter, the signals I/O 0 to I/O 7 at the address "ADD1" are described as signals A0 to A7, respectively. Similarly, the signals I/O 0 to I/O 7 at the address "ADD2" are described as signals A8 to A15, respectively. The signals I/O 0 to I/O 7 at the address "ADD3" are described as signals A16 to A23, respectively. The signals I/O 0 to I/O 7 at the address "ADD4" are described as signals A24 to A31, respectively. The signals I/O 0 to I/O 7 at the address "ADD5" are described as signals A32 to A39, respectively. The signals I/O 0 to I/O 7 at the address "ADD6" are described as signals A40 to A47, respectively.

In the example of FIG. 8, the signals A0 to A12 indicate the column address CA corresponding to the data length 2X, that is, the bit line BL. The signals A16 and A17 indicate a target string unit SU. The signals A18 to A24 indicate a target word line WL. The signals A25 to A28 indicate the plane address PA, that is, a target logical plane PBL (N). The signals A29 to A38 indicate a target block BLK. The signals A39 to A41 indicate a target chip, that is, the semiconductor memory device 100. The signals A13 to A15 and A42 to A47 are unused. Further, the information allocated to the signals A0 to A47 may be set according to the number of the semiconductor memory devices 100, the configuration of the memory cell array 20, the data length of one page, etc.

Next, the logical-to-physical address conversion operation in the logical-to-physical address conversion circuit 31 will be described.

When the logical addresses "ADD1" to "ADD6" of six cycles corresponding to the logical plane PBL (N) are received, the logical-to-physical address conversion circuit 31 converts the received logical addresses "ADD1" to "ADD6" into the physical addresses "ADD1" to "ADD6" of six cycles corresponding to the physical plane PBP (2N), and the physical addresses "ADD1" to "ADD6" of 6 cycles corresponding to the physical plane PBP (2N+1).

More specifically, when converting the logical addresses "ADD1" to "ADD6" of 6 cycles corresponding to the logical plane PBL (N) into the physical addresses "ADD1" to "ADD6" of 6 cycles corresponding to the physical plane PBP (2N), the logical-to-physical address conversion circuit 31 converts the signals A0 to A12 corresponding to the column address CA of data length 2X in the logical address ADD into the signals A0 to A11 corresponding to the column address CA of data length X. The logical-to-physical address conversion circuit 31 converts the signals A25 to A28 corresponding to the logical plane PBL (N) in the logical address ADD into the signals A25 to A28 corresponding to the physical plane.

The signals A16 to A24 and the signals A29 to A41 in the physical address ADD are the same as the signals A16 to A24 and the signals A29 to A41 in the logical address ADD. However, when the configurations of the block BLK, the string unit SU, and the word line WL in the logical plane PBL are different from the configurations of the block BLK, the string unit SU, and the word line WL in the physical plane PBP, the signals A16 to A24 and the signals A29 to A41 in the physical address ADD may be different from the signals A16 to A24 and the signals A29 to A41 in the logical address ADD.

After address conversion, the logical-to-physical address conversion circuit 31 transmits, to the first address register 14*a*, the physical addresses "ADD1" to "ADD6" corresponding to the physical plane PBP (2N).

The logical-to-physical address conversion circuit 31 also transmits, to the first command register 15*a*, a command CMD corresponding to the physical plane PBP (2N). The logical-to-physical address conversion circuit 31 does not invert the information based on commands "01h" and "02h," that is, the information on the lower page and the upper page. As a result, when the command set of the read instruction includes the command "01h" corresponding to the lower page of the logical plane PBL (N), the read operation of the lower page is executed in the physical plane PBP (2N). Similarly, when the command set of the read instruction includes the command "02h" corresponding to the upper page of the logical plane PBL (N), the read operation of the upper page is executed in the physical plane PBP (2N).

Further, when converting the logical addresses "ADD1" to "ADD6" of six cycles corresponding to the logical plane PBL (N) into the physical addresses "ADD1" to "ADD6" of six cycles corresponding to the physical plane PBP (2N+1), the logical-to-physical address conversion circuit 31 converts the signals A0 to A12 corresponding to the column address CA of data length 2X in the logical address ADD into the signals A0 to A11 corresponding to the column address CA of data length X. The logical-to-physical address conversion circuit 31 converts the signals A25 to A28 corresponding to the logical plane PBL (N) in the logical address ADD into the signals A25 to A28 corresponding to the physical plane PBP (2N+1).

Further, similarly to the physical plane PBP (2N), the signals A16 to A24 and the signals A29 to A41 in the physical address ADD are the same as the signals A16 to A24 and the signals A29 to A41 in the logical address ADD.

After address conversion, the logical-to-physical address conversion circuit 31 transmits, to the second address register 14b, the physical addresses "ADD1" to "ADD6" corresponding to the physical plane PBP (2N+1).

Also, the logical-to-physical address conversion circuit 31 transmits, to the second command register 15b, a command CMD corresponding to the physical plane PBP (2N+1). At this time, the logical-to-physical address conversion circuit 31 inverts the information based on the commands "01h" and "02h," that is, the information on the lower page and the upper page. As a result, when the command set of the read instruction includes the command "01h" corresponding to the lower page of the logical plane PBL (N), the read operation of the upper page is executed in the physical plane PBP (2N+1). Similarly, when the command set of the read instruction includes the command "02h" corresponding to the upper page of the logical plane PBL (N), the read operation of the lower page is executed in the physical plane PBP (2N+1).

1.4 Read Operation

Next, the read operation will be described.

1.4.1 Relationship Between Read Page And Reading Order of Data

First, the relationship between the read page and the reading order of data will be described with reference to FIG. 9.

Figure 9:
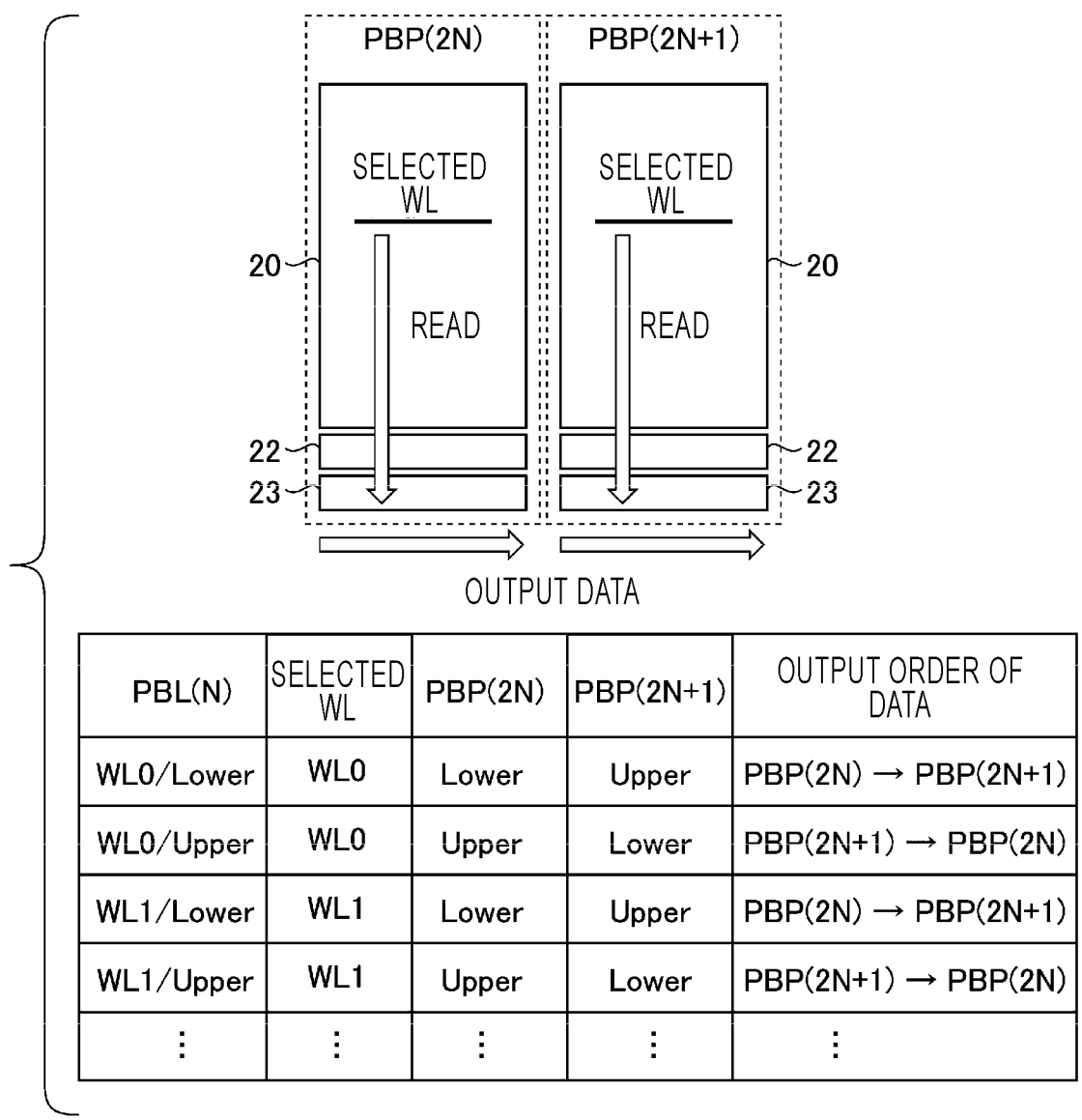
FIG. 9 is a diagram illustrating a read operation in the semiconductor memory device according to the first embodiment.

As illustrated in FIG. 9, in the read operation, the semiconductor memory device 100 reads data of the lower page in one physical plane PBP, and in parallel reads data of the upper page in the other physical plane PBP.

For example, when the lower page is a read target in the logical plane PBL (N), the lower page is selected as the read target in the physical plane PBP (2N), and the upper page is selected as the read target in the physical plane PBP (2N+1). Then, the read data stored in the respective data registers 23 of the physical planes PBP (2N) and PBP (2N+1) are output in order of the physical plane PBP (2N) and the physical plane (2N+1).

On the other hand, when the upper page is the read target in the logical plane PBL (N), the upper page is selected as the read target in the physical plane PBP (2N), and the lower page is selected as the read target in the physical plane PBP (2N+1). Then, the read data stored in the respective data registers 23 of the physical planes PBP (2N) and PBP (2N+1) are output in order of the physical plane PBP (2N+1) and the physical plane (2N).

More specifically, for example, when the lower page of the word line WL0 of the logical plane PBL (N) is designated in the command set of the read instruction, the word line WL0 in the physical planes PBP (2N) and PBP (2N+1) (hereinafter, also referred to as a selected word line WL) is selected. In the physical plane PBP (2N), an operation of reading the lower page of the word line WL0 is executed, and the read data is stored in the data register 23. Further, the read operation of the upper page of the word line WL0 is executed in the physical plane PBP (2N+1), and the read data is stored in the data register 23. After outputting the data of the physical plane PBP (2N), the data input/output circuit 10b outputs the data of the physical plane PBP (2N+1).

Also, for example, when the upper page of the word line WL0 of the logical plane PBL (N) is designated in the command set of the read instruction, the read operation of the upper page of the selected word line WL0 is executed in the physical plane PBP (2N), and the read data is stored in the data register 23. Further, the operation of reading the lower page of the selected word line WL0 is executed in the physical plane PBP (2N+1), and the read data is stored in the data register 23. After outputting the data of the physical plane PBP (2N+1), the data input/output circuit 10b outputs the data of the physical plane PBP (2N).

A case where the lower page or upper page of the word lines WL1 to WL95 of the logical plane PBL (N) is designated in the command set of the read instruction is similar to a case where the lower page or upper page of the word line WL0 is selected.

1.4.2 Timing of Command Sequence and Read Operation

Next, the command sequence and the timing of the read operation will be described with reference to FIG. 10. Further, in the example of FIG. 10, in order to simplify the description, the address ADD is described in one cycle.

Figure 10:
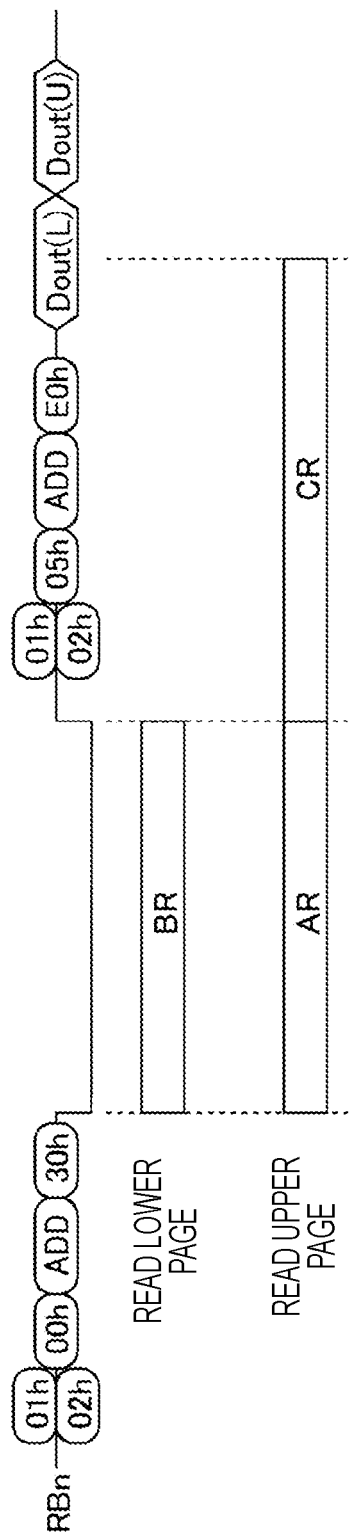
FIG. 10 is a diagram illustrating a command sequence of the read operation input to the semiconductor memory device according to the first embodiment.

As illustrated in FIG. 10, when a command set of the read instruction (the command "01h" or "02h," the command "00h," the address ADD, and the command "30h") is received, the sequencer module 16 sets the signal RBn to the "L" level, and starts operations of reading the lower page and the upper page, respectively. More specifically, when the command set of the read instruction includes the command "01h," the first sequencer 16a starts an operation of reading the lower page in the physical plane PBP (2N), and the second sequencer 16b starts an operation of reading the upper page in the physical plane PBP (2N+1). In addition, when the command set of the read instruction includes the command "02h," the first sequencer 16a starts an operation of reading the upper page in the physical plane PBP (2N), and the second sequencer 16b starts an operation of reading the lower page in the physical plane PBP (2N+1).

Since the lower page is determined by the read operation BR and the upper page is determined by the read operations AR and CR, the operation of reading the lower page ends first.

The sequencer module 16 stores the read data of the lower page in the data register 23, and sets the signal RBn to the "H" level when the read operation BR is completed. As a result, the semiconductor memory device 100 may output data to the controller 200.

When the signal RBn at the "H" level is received, the controller 200 instructs the semiconductor memory device 100 to output data. More specifically, the controller 200 first transmits, to the semiconductor memory device 100, the command "01h" which designates the lower page or the command "02h" which designates the upper page.

Next, the controller 200 transmits, to the semiconductor memory device 100, a command "05h" which notifies that the operation of outputting data is to be executed.

Next, the controller 200 transmits the logical address ADD to the semiconductor memory device 100.

Next, the controller 200 transmits, to the semiconductor memory device 100, a command "E0h" which instructs the execution of the data output operation. Hereinafter, a combination of commands corresponding to the data output operation is also referred to as a command set of the output instruction. When there is no change in the logical address ADD, the command set of the output instruction may be omitted.

The data input/output circuit 10b starts outputting the data "Dout (L)" of the lower page according to the signal REn received from the controller 200.

While outputting the data "Dout (L)," the sequencer module 16 ends the operation of reading the upper page.

When the operation of outputting the data "Dout (L)" is completed, the data input/output circuit 10b continuously outputs the data "Dout (U)" of the upper page.

More specifically, in the case of the read operation corresponding to the lower page of the logical plane PBL (N), when the operation of reading the lower page of the physical plane PBP (2N) is completed, the data output operation is started. Further, in the case of the read operation corresponding to the upper page of the logical plane PBL (N), when the operation of reading the lower page of the physical plane PBP (2N+1) is completed, the data output operation is started. That is, regardless of the lower page or the upper page of the logical plane PBL (N), the semiconductor memory device 100 starts the data output operation when the operation of reading the lower page of any physical plane PBP is completed.

Since the data length of one page in the physical plane PBP is half the data length of one page in the logical plane PBL, the period of the operation of reading the lower page in the semiconductor memory device 100 is shorter than, for example, the period of reading the data of one page in the logical plane PBL.

1.5 Write Operation

Next, the write operation will be described. Descriptions will be made below on a case where the lower page and the upper page are collectively written.

1.5.1 Writing Order of Data

First, the writing order of data will be described with reference to FIG. 11. In the present embodiment, in order to accommodate the logic of the above-described read operation, where the lower page and the upper page are reversed in the physical plane PBP (2N+1) relative to the logical page, when dividing write data and writing the divided data in the physical planes PBP (2N) and PBP (2N+1), the order of writing into the physical planes PBP (2N) and PBP (2N+1) is different based on whether the word line being written is an even-numbered word line WL or an odd-numbered word line.

Figure 11:
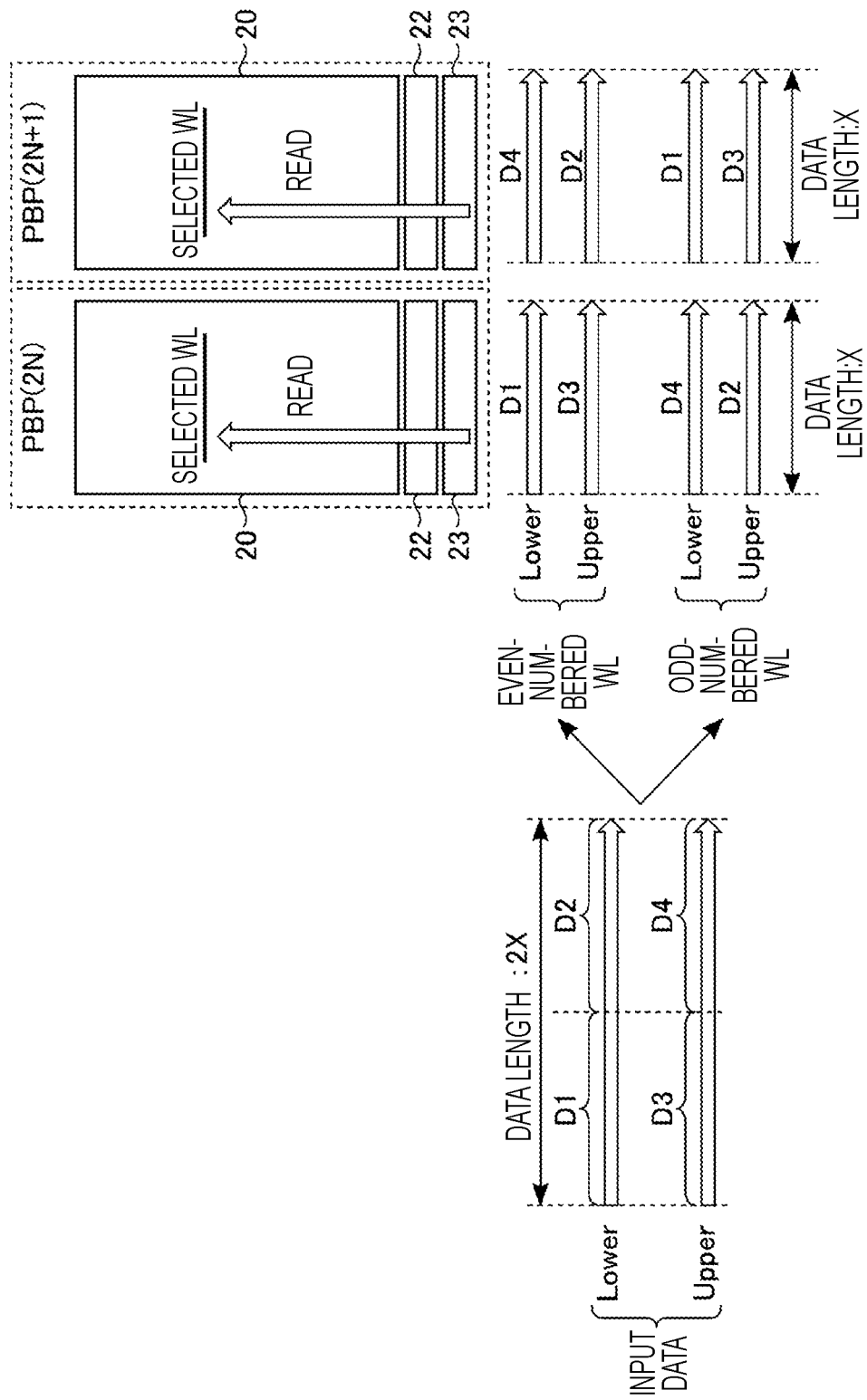
FIG. 11 is a diagram illustrating a write operation in the semiconductor memory device according to the first embodiment.

As illustrated in FIG. 11, in the lower page of write data having data length 2X, the first half of the data (data length X) is represented as data D1, and the second half of the data (data length X) is represented as data D2. Similarly, in the upper page of write data having data length 2X, the first half of the data (data length X) is represented as data D3, and the second half of the data (data length X) is represented as data D4.

For example, when the write data is written to the even-numbered word line WL, the sequencer module 16 writes the data D1 to the lower page of the physical plane PBP (2N) and writes the data D2 to the upper page of the physical plane PBP (2N+1). The sequencer module 16 also writes the data D3 to the upper page of the physical plane PBP (2N) and writes the data D4 in the lower page of the physical plane PBP (2N+1).

Also, for example, when the write data is written to the odd-numbered word line WL, the sequencer module 16 writes the data D1 to the lower page of the physical plane PBP (2N+1) and the data D2 to the upper page of the physical plane PBP (2N). The sequencer module 16 also writes the data D3 to the upper page of the physical plane PBP (2N+1) and writes the data D4 to the lower page of the physical plane PBP (2N).

That is, the semiconductor memory device 100 stores data of one page of the logical plane PBL (lower page or upper page) in one physical plane PBP, as data of the lower page, and stores such data in the other physical plane PBP, as data of the upper page.

1.5.2 Command Sequence

Next, the command sequence will be described with reference to FIG. 12. Further, in the example of FIG. 12, in order to simplify the description, the address ADD is described in one cycle.

Figure 12:
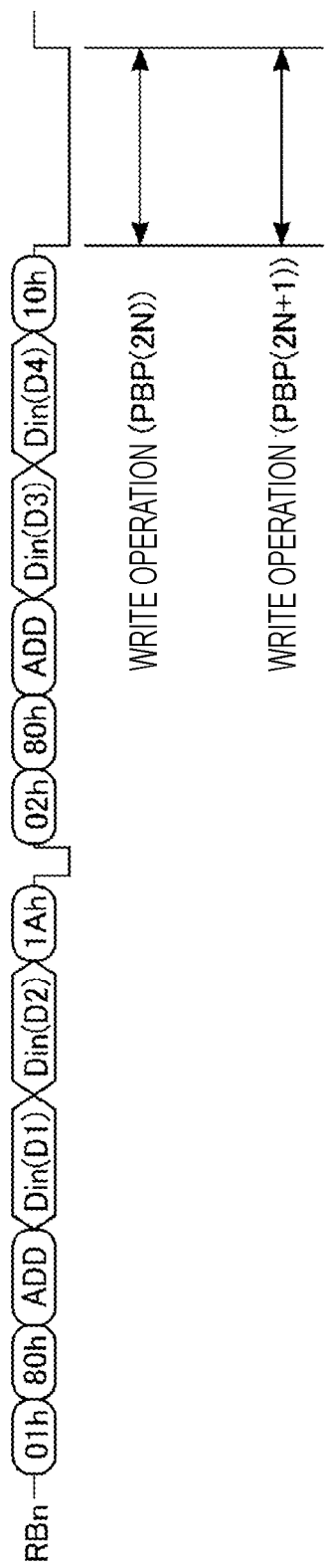
FIG. 12 is a diagram illustrating a command sequence of the write operation input to the semiconductor memory device according to the first embodiment.

As illustrated in FIG. 12, the controller 200 first transmits, to the semiconductor memory device 100, the command "01h" which designates the lower page.

Next, the controller 200 transmits, to the semiconductor memory device 100, a command "80h" which notifies that the write operation is to be executed.

Next, the controller 200 transmits the logical address ADD to the semiconductor memory device 100.

Next, the controller 200 transmits the data of the lower page of data length 2X, that is, data D1 and D2 (reference numerals "Din (D1)" and "Din (D2)" in FIG. 12) to the semiconductor memory device 100.

Next, the controller 200 transmits a command "1Ah" to the semiconductor memory device 100. When the command "1Ah" is received, the sequencer module 16 sets the ready/busy signal RBn to the "L" level. In the physical planes PBP (2N) and PBP (2N+1), the data D1 and D2 stored in each data register 23 is transferred to each of the corresponding sense amplifiers 22.

When the transfer of the data D1 and D2 to the sense amplifier 22 is completed, the sequencer module 16 sets the ready/busy signal RBn to the "H" level.

Next, the controller 200 transmits, to the semiconductor memory device 100, the command "02h" that designates the upper page.

Next, the controller 200 sequentially transmits the command "80h" and the logical address ADD to the semiconductor memory device 100.

Next, the controller 200 transmits data of the upper page of data length 2X, that is, data D3 and D4 (reference numerals "Din (D3)" and "Din (D4)" in FIG. 12) to the semiconductor memory device 100.

Next, the controller 200 transmits, to the semiconductor memory device 100, a command "10h" which instructs the execution of the write operation. When the command "10h" is received, the sequencer module 16 sets the signal RBn to the "L" level. In the physical planes PBP (2N) and PBP (2N+1), the write operation is executed after the data D3 and D4 stored in each data register 23 is transferred to each of the corresponding sense amplifier 22.

When the write operation is completed, the sequencer module 16 sets the signal RBn to the "H" level.

1.6 Effect According to the Present Embodiment

With the configuration according to the present embodiment, it is possible to provide a semiconductor memory device capable of improving the processing speed. This effect will be described in detail.

For example, when the data of the lower page is read, the semiconductor memory device determines the data by one read operation BR, but when the data of the upper page is read, the semiconductor memory device determines the data by the second read operations AR and CR. Therefore, the processing time tends to be longer in the operation of reading the upper page than in the operation of reading the lower page.

In contrast, in the configuration according to the present embodiment, the semiconductor memory device 100 includes two physical planes PBP (2N) and PBP (2N+1) corresponding to one logical plane PBL (N), and may divide the data of one page of the logical plane PBL (N) and store such data in two physical planes PBP (2N) and PBP (2N+1). In addition, when storing data in the two physical planes PBP (2N) and PBP (2N+1), the semiconductor memory device 100 may store the data in one physical plane PBP, as data of the lower page, and store the data in the other physical plane PBL, as data of the upper page. As a result, regardless of whether the data is from the lower page or the upper page of the logical plane PBL, when the operation of reading the lower page of one physical plane PBP is completed, the semiconductor memory device 100 may start the operation of outputting data. Thus, while outputting the data of the lower page, the semiconductor memory device 100 may end the operation of reading the upper page in the other physical plane PBP and continuously output data of the upper page. Therefore, in the read operation corresponding to the upper page of the logical plane PBL, the period from the start of the read operation to the start of the data output may be shortened. Thus, the processing speed of the semiconductor memory device 100 may be improved.

Further, with the configuration according to the present embodiment, the data length of one page in one physical plane PBP may be half of the data length of one page in one logical plane PBL. Therefore, the period of the operation of reading the lower page in the physical plane PBP may be made shorter than the period of the operation of reading the lower page in the logical plane PBL. Therefore, in the read operation corresponding to the lower page of the logical plane PBL, the period from the start of the read operation to the start of the data output may be shortened. Thus, the processing speed of the semiconductor memory device 100 may be improved.

2. Second Embodiment

Next, a second embodiment will be described. In the second embodiment, two examples are presented for the case where plural read instructions are successively executed. Hereinafter, differences from the first embodiment will be mainly described.

2.1. First Example

Figure 13:
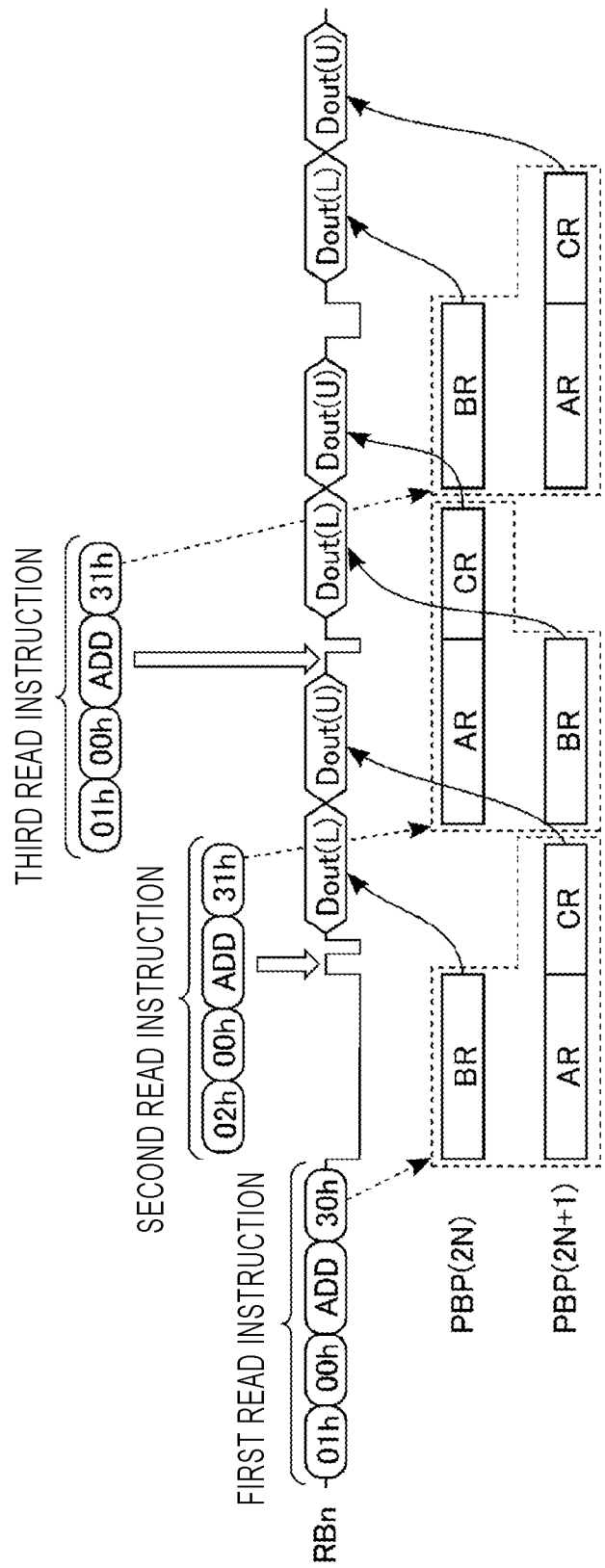
FIG. 13 is a diagram illustrating the command sequence of the read operation input to the semiconductor memory device according to a first example of a second embodiment and the order of the read operation.

A first example will be described first with reference to FIG. 13. The example of FIG. 13 represents a case where three read instructions are received. Further, in the example of FIG. 13, the command set of the data output instruction is omitted to simplify the description.

As illustrated in FIG. 13, the controller 200 first transmits, to the semiconductor memory device 100, a command set of a first read instruction (the command "01h," the command "00h," the address ADD, and the command "30h").

When the command set of the first read instruction is received, the sequencer module 16 sets the signal RBn to the "L" level, and executes the read operation corresponding to the first read instruction. More specifically, the first sequencer 16a executes the read operation BR corresponding to the lower page in the physical plane PBP (2N). The second sequencer 16b executes the read operations AR and CR corresponding to the upper page in the physical plane PBP (2N+1).

When the read operation BR is completed in the physical plane PBP (2N), the sequencer module 16 (first sequencer 16a) sets the signal RBn to the "H" level.

When the signal RBn at the "H" level is received, the controller 200 transmits, to the semiconductor memory device 100, a command set of the second read instruction (the command "02h," the command "ooh," the address ADD, and a command "31h"). The command "31h" is a command to reserve execution of the command set of the read instruction including the command "31h" so that it starts after the completion of the read instruction being executed (which, in this example, is the first read instruction).

Further, irrespective of whether the read instruction being executed is a read instruction corresponding to the lower page of the logical plane PBL or a read instruction corresponding to the upper page thereof, the command set of the read instruction including the command "31h" may reserve execution of the read operation corresponding to the lower page of the logical plane PBL or execution of the read operation corresponding to the upper page of the logical plane PBL.

When the command set of the second read instruction is received, the sequencer module 16 sets the signal RBn to the "L" level, and stores the command set of the second read instruction in the register module 12.

When the storage of the command set in the register module 12 is completed, the sequencer module 16 sets the signal RBn to the "H" level.

When the signal RBn at the "H" level is received, the controller 200 causes the data input/output circuit 10b to start an operation of outputting data corresponding to the first read instruction.

When the read operation CR corresponding to the first read instruction (the operation of reading the upper page in the physical plane PBP (2N+1)) is completed while the data input/output circuit 10b is outputting data "Dout (L)" of the lower page corresponding to the first read instruction, the sequencer module 16 starts the read operation corresponding to the reserved second read instruction. More specifically, the first sequencer 16a executes the read operations AR and CR corresponding to the upper page in the physical plane PBP (2N). The second sequencer 16b executes the read operation BR corresponding to the lower page in the physical plane PBP (2N+1).

When the operation of outputting data "Dout (L)" of the lower page corresponding to the first read instruction is completed while the read operations AR and BR are being executed, the data input/output circuit 10b continues executing the operation of outputting the data "Dout (U)" of the upper page corresponding to the first read instruction.

When the operation of outputting data corresponding to the first read instruction is completed, the controller 200 transmits, to the semiconductor memory device 100, a command set of the third read instruction (the command "01h," the command "00h," the address ADD, and the command "31h").

When the command set of the third read instruction is received, the sequencer module 16 sets the signal RBn to the "L" level.

When the read operation BR corresponding to the second read instruction is completed, the sequencer module 16 (second sequencer 16b) sets the signal RBn to the "H" level.

When the signal RBn at the "H" level is received, the controller 200 causes the data input/output circuit 10b to start an operation of outputting data corresponding to the second read instruction.

When the read operation CR corresponding to the second read instruction is completed while the data input/output circuit 10b is outputting data "Dout (L)" of the lower page corresponding to the second read instruction, the sequencer module 16 starts the read operation corresponding to the reserved third read instruction. More specifically, the first sequencer 16a executes the read operation BR corresponding to the lower page in the physical plane PBP (2N). The second sequencer 16b executes the read operations AR and CR corresponding to the upper page in the physical plane PBP (2N+1).

When the operation of outputting the data "Dout (L)" of the lower page corresponding to the second read instruction is completed while the read operations AR and BR corresponding to the third read instruction are executed, the data input/output circuit 10b continues executing the operation of outputting the data "Dout (U)" of the upper page corresponding to the second read instruction.

When the operation of outputting the data corresponding to the second read instruction is completed, the sequencer module 16 sets the signal RBn to the "L" level.

When the read operation BR corresponding to the third read instruction is completed, the sequencer module 16 (first sequencer 16a) sets the signal RBn to the "H" level.

When the signal RBn at the "H" level is received, the controller 200 causes the data input/output circuit 10b to start an operation of outputting data corresponding to the third read instruction.

While the data input/output circuit 10b is outputting the data "Dout (L)" of the lower page corresponding to the third read instruction, the read operation CR corresponding to the third read instruction is completed.

When the operation of outputting the data "Dout (L)" of the lower page corresponding to the third read instruction is completed, the data input/output circuit 10b continues executing the operation of outputting the data "bout (U)" of the upper page corresponding to the third read instruction.

2.2 Second Example

Figure 14:
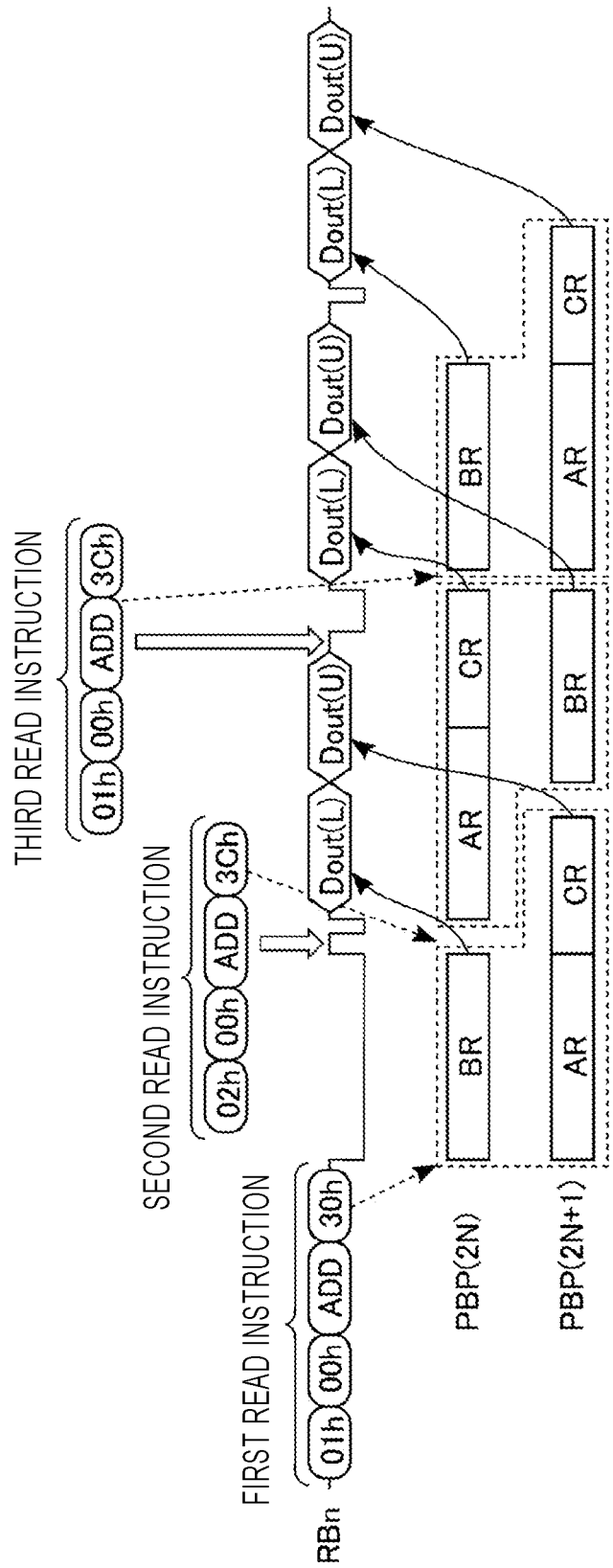
FIG. 14 is a diagram illustrating the command sequence of the read operation input to the semiconductor memory device according to a second example of the second embodiment and the order of the read operation.

First, a second example will be described with reference to FIG. 14. The example of FIG. 14 represents a case where three read instructions are received. Further, in the example of FIG. 14, the command set of the data output instruction is omitted to simplify the description.

As illustrated in FIG. 14, the controller 200 first transmits a command set of a first read instruction (the command "01h," the command "00h," the address ADD, and the command "30h") to the semiconductor memory device 100.

When the command set of the first read instruction is received, the sequencer module 16 sets the signal RBn to the "L" level and executes the read operation corresponding to the first read instruction. More specifically, the first sequencer 16a executes the read operation BR corresponding to the lower page in the physical plane PBP (2N). The second sequencer 16b executes the read operations AR and CR corresponding to the upper page in the physical plane PBP (2N+1).

When the read operation BR is completed in the physical plane PBP (2N), the sequencer module 16 (first sequencer 16a) sets the signal RBn to the "H" level.

When the signal RBn at the "H" level is received, the controller 200 transmits, to the semiconductor memory device 100, a command set of the second read instruction (the command "02h," the command "00h," the address ADD, and a command "3Ch"). The command "3Ch" is a command to reserve execution of the read operation corresponding to the command set of the read instruction including the command "3Ch" so that it starts when the read operation BR being executed is completed in any physical plane PBP.

Further, when a command set of a read instruction including the command "3Ch" is transmitted, the page of the logical plane PBL corresponding to the command set (the lower page or the upper page) is set to be different from the page of the logical plane PBL corresponding to the read instruction being executed. More specifically, for example, when the read instruction being executed is a read operation corresponding to the lower page of the logical plane PBL, the execution of the read operation corresponding to the upper page of the logical plane PBL is reserved. Also, for example, when the read instruction being executed is a read operation corresponding to the upper page of the logical plane PBL, the execution of the read operation corresponding to the lower page of the logical plane PBL is reserved.

When the command set of the second read instruction is received, the sequencer module 16 sets the signal RBn to the "L" level and stores the command set of the second read instruction in the register module 12.

When the storage of the command set in the register module 12 is completed, the sequencer module 16 sets the signal RBn to the "H" level.

The sequencer module 16 (first sequencer 16a) starts the read operation corresponding to the reserved second read instruction in the physical plane PBP (2N) in which the read operation BR corresponding to the first read instruction is completed. More specifically, the first sequencer 16a executes the read operations AR and CR corresponding to the upper page in the physical plane PBP (2N).

When the signal RBn at the "H" level is received, the controller 200 causes the data input/output circuit 10b to start an operation of outputting data corresponding to the first read instruction.

When the read operation CR corresponding to the first read instruction (the operation of reading the upper page in the physical plane PBP (2N+1)) is completed while the data input/output circuit 10b is outputting the data "Dout (L)" of the lower page corresponding to the first read instruction, the sequencer module 16 (second sequencer 16b) starts the read operation corresponding to the reserved second read instruction in the physical plane PBP (2N+1). More specifically, the second sequencer 16b executes the read operation BR corresponding to the lower page in the physical plane PBP (2N+1).

As described above, in the present example, in the read operation corresponding to the even-numbered read instruction, the read operation corresponding to the upper page is started earlier than the read operation corresponding to the lower page. Further, in the even-numbered read instruction, in order to match the end timing of the read operation corresponding to the upper page and the end timing of the read operation corresponding to the lower page, the sequencer module 16 may start the read operation AR corresponding to the upper page, and then start the read operation BR corresponding to the lower page after a preset period has elapsed.

When the operation of outputting the data "Dout (L)" of the lower page corresponding to the first read instruction is completed, the input/output circuit 10b continues executing the operation of outputting the data "Dout (U)" of the upper page corresponding to the first read instruction.

When the operation of outputting data corresponding to the first read instruction is completed, the controller 200 transmits, to the semiconductor memory device 100, a command set of the third read instruction (the command "01h," the command "00h," the address ADD, and the command "31h").

When the command set of the third read instruction is received, the sequencer module 16 sets the signal RBn to the "L" level.

When the read operation BR corresponding to the second read instruction is completed, the sequencer module 16 (second sequencer 16b) sets the signal RBn to the "H" level.

The sequencer module 16 starts the read operation corresponding to the reserved third read instruction. More specifically, the first sequencer 16a executes the read operation BR corresponding to the lower page in the physical plane PBP (2N). The second sequencer 16b executes the read operations AR and CR corresponding to the upper page in the physical plane PBP (2N+1).

When the signal RBn at the "H" level is received, the controller 200 causes the data input/output circuit 10b to start an operation of outputting data corresponding to the second read instruction.

The data input/output circuit 10b executes an operation of outputting the data "Dout (L)" of the lower page and the data "bout (U)" of the upper page corresponding to the second read instruction.

When the operation of outputting the data corresponding to the second read instruction is completed, the sequencer module 16 sets the signal RBn to the "L" level.

When it is confirmed that the read operation BR corresponding to the third read instruction is completed, the sequencer module 16 (first sequencer 16a) sets the signal RBn to the "H" level.

When the signal RBn at the "H" level is received, the controller 200 causes the data input/output circuit 10b to start an operation of outputting data corresponding to the third read instruction.

While the data input/output circuit 10b is outputting the data "Dout (L)" of the lower page corresponding to the third read instruction, the read operation CR corresponding to the third read instruction is completed.

When the operation of outputting the data "Dout (L)" of the lower page corresponding to the third read instruction is completed, the data input/output circuit 10b continues executing an operation of outputting the data "Dout (U)" of the upper page corresponding to the third read instruction.

2.3 Effects According to the Present Embodiment

With the configuration according to the present embodiment, the same effect as that of the first embodiment may be obtained.

Further, in the configuration according to the second example of the present embodiment, since the read operation CR corresponding to the odd-numbered read instruction and the read operation AR corresponding to the even-numbered read instruction may be executed in parallel, the entire processing time may be shortened when plural read instructions are continuously executed.

3. Modifications

The semiconductor memory device according to the above-described embodiment includes: first and second planes (PBP (2N) and PBP (2N+1)), each including a memory cell array (20) including plural memory cells capable of storing at least first and second data; a control circuit (16) configured to control a read operation and a write operation; and an input/output circuit (10). The first data (e.g., lower page) is determined by a first read operation (BR) corresponding to a first read voltage (VB). The second data (e.g., upper page) is determined by a second read operation (AR) corresponding to a second read voltage (VA) and a third read operation (CR) corresponding to a third read voltage (VC). When the first read instruction instructing reading of the first data is received from the external controller (200), the control circuit reads the first data from the first plane and reads the second data from the second plane, and the input/output circuit sequentially outputs the first data read from the first plane and the second data read from the second plane. When the second read instruction instructing reading of the second data is received from the external controller (200), the control circuit reads the second data from the first plane and reads the first data from the second plane, and the input/output circuit sequentially outputs the first data read from the second plane and the second data read from the first plane.

It is possible to provide a semiconductor memory device capable of improving the processing speed by applying the above-described embodiment thereto.

Further, the embodiments are not limited to the above-described embodiment, and various modifications are possible.

For example, the memory cell transistor MT may store three or more bits of data.

Further, in the above-described embodiment, descriptions have been made on a case where the physical plane PBP (2N) and the physical plane (2N+1) include different row decoders 21, but the physical plane PBP (2N) and the physical plane (2N+1) may share one row decoder 21.

Further, in the above-described embodiment, descriptions have been made on a case where data of one logical plane PBL is stored in two physical planes PBP in one semiconductor memory device 100, but such data may be stored in the physical planes PBP of two semiconductor memory devices.

In addition, data of one logical plane PBL may be stored in three or more physical planes PBP in one semiconductor memory device 100.

Further, in the above-described embodiment, the semiconductor memory device is not limited to a three-dimensional stacked NAND-type flash memory. The present disclosure may be applied to a planar NAND-type flash memory, and may also be applied to a nonvolatile memory which includes memory cells capable of holding 2 bits or more of data.

Furthermore, the term "connection" in the above-described embodiment also includes a state of being indirectly connected with a certain element, such as a transistor or a resistor, interposed therebetween.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory cell array that includes a plurality of first blocks, each first block including a plurality of first memory cells, each of the first memory cells capable of being set into one of n threshold voltage levels, n being an integer of 4 or more;
   a plurality of first word lines, each first word line being connected to a gate of a corresponding one of the first memory cells in each of the first blocks;
   a plurality of first bit lines electrically connected to one ends of the first memory cells of each first block, respectively;
   a plurality of first sense amplifiers connected to the first bit lines, respectively;
   a second memory cell array that includes a plurality of second blocks, each second block including a plurality of second memory cells, each of the second memory cells capable of being set into one of n threshold voltage levels;
   a plurality of second word lines, each second word line being connected to a gate of a corresponding one of the second memory cells in each of the second blocks;
   a plurality of second bit lines electrically connected to one ends of the second memory cells of each second block, respectively; and
   a plurality of second sense amplifiers connected to the second bit lines, respectively, wherein
   upon receipt of a first read command associated with a first address,
      one of the first word lines is applied with i kinds of voltages, and one of the second word lines is applied with j kinds of voltages, i being an integer of 1 or more, j being an integer larger than i, and
   upon receipt of a second read command associated with a second address,
      the one of the second word lines is applied with k kinds of voltages, and the one of the first word lines is applied with l kinds of voltages, k being an integer of 1 or more, l being an integer larger than k.

2. The semiconductor memory device according to claim 1, further comprising:
   a first row decoder configured to control voltages applied to the first word lines; and
   a second row decoder configured to control voltages applied to the second word lines, wherein
   upon receipt of the first read command associated with the first address,
      the first row decoder applies the i kinds of voltages to the one of the first word lines, and
      the second row decoder applies the j kinds of voltages to the one of the second word lines, and
   upon receipt of the second read command associated with the second address,
      the second row decoder applies the k kinds of voltages to the one of the second word lines, and
      the first row decoder applies the l kinds of voltages to the one of the first word lines.

3. The semiconductor memory device according to claim 2, further comprising:
   a first address register connected to the first row decoder; and
   a second address register connected to the second row decoder, wherein
   upon receipt of the first read command associated with the first address,
      the first address register stores the first address, and
      the second address register stores a third address obtained by inverting at least part of the first address, and
   upon receipt of the second read command associated with the second address,
      the second address register stores the second address, and
      the first address register stores a fourth address obtained by inverting at least part of the second address.

4. The semiconductor memory device according to claim 3, wherein
   the first address and the third address are different page addresses, and
   the second address and the fourth address are different page addresses.

5. The semiconductor memory device according to claim 4, wherein
   the first address and the third address target the same word line, and
   the second address and the fourth address target the same word line.

6. The semiconductor memory device according to claim 5, further comprising:
   an input/output circuit connected to the first sense amplifiers and to the second sense amplifiers, wherein
   the first sense amplifiers read data from the first memory cells via the first bit lines,
   the second sense amplifiers read data from the second memory cells via the second bit lines,
   in response to the first read command,
      the first sense amplifiers transfer the data read from the first memory cells to the input/output circuit, and thereafter the second sense amplifiers transfer the data read from the second memory cells to the input/output circuit, and
   in response to the second read command,
      the second sense amplifiers transfer the data read from the second memory cells to the input/output circuit, and thereafter the first sense amplifiers transfer the data read from the first memory cells to the input/output circuit.

7. The semiconductor memory device according to claim 6, wherein
   in response to the first read command,
      the first sense amplifiers start transferring the data read from the first memory cells to the input/output circuit while one of the j kinds of voltages is applied to the one of the second word lines, and
   in response to the second read command,
      the second sense amplifiers start transferring the data read from the second memory cells to the input/output circuit, while one of the l kinds of voltages is applied to the one of the first word lines.

8. The semiconductor memory device according to claim 7, wherein
in response to a first data out command after the first read command,
the input/output circuit starts outputting the data transferred from the first sense amplifiers, while one of the j kinds of voltages is applied to the one of the second word lines, and
in response to a second data out command after the second read command,
the input/output circuit starts outputting the data transferred from the second sense amplifiers, while one of the l kinds of voltages is applied to the one of the first word lines.

9. The semiconductor memory device according to claim 1, wherein
i is equal to k, and
j is equal to l.

10. The semiconductor memory device according to claim 1, wherein
i and k are each 1, and
j and l are each 2.

11. A method of operating a semiconductor memory device comprising:
a first memory cell array that includes a plurality of first blocks, each first block including a plurality of first memory cells, each of the first memory cells capable of being set into one of n threshold voltage levels, n being an integer of 4 or more;
a plurality of first word lines, each first word line being connected to a gate of a corresponding one of the first memory cells in each of the first blocks;
a plurality of first bit lines electrically connected to one ends of the first memory cells of each first block, respectively;
a plurality of first sense amplifiers connected to the first bit lines, respectively;
a second memory cell array that includes a plurality of second blocks, each second block including a plurality of second memory cells, each of the second memory cells capable of being set into one of n threshold voltage levels;
a plurality of second word lines, each second word line being connected to a gate of a corresponding one of the second memory cells in each of the second blocks;
a plurality of second bit lines electrically connected to one ends of the second memory cells of each second block, respectively; and
a plurality of second sense amplifiers connected to the second bit lines, respectively,
said method comprising:
upon receipt of a first read command associated with a first address,
applying i kinds of voltages to one of the first word lines, and j kinds of voltages to one of the second word lines, i being an integer of 1 or more, j being an integer larger than i, and
upon receipt of a second read command associated with a second address,
applying k kinds of voltages to the one of the second word lines, and l kinds of voltages to the one of the first word lines, k being an integer of 1 or more, l being an integer larger than k.

12. The method according to claim 11, wherein
the semiconductor memory device further comprises:
a first row decoder configured to control voltages applied to the first word lines; and
a second row decoder configured to control voltages applied to the second word lines,
upon receipt of the first read command associated with the first address,
the first row decoder applies the i kinds of voltages to the one of the first word lines, and
the second row decoder applies the j kinds of voltages to the one of the second word lines, and
upon receipt of the second read command associated with the second address,
the second row decoder applies the k kinds of voltages to the one of the second word lines, and
the first row decoder applies the l kinds of voltages to the one of the first word lines.

13. The method according to claim 12, wherein
the semiconductor memory device further comprises:
a first address register connected to the first row decoder; and
a second address register connected to the second row decoder,
upon receipt of the first read command associated with the first address,
the first address register stores the first address, and
the second address register stores a third address obtained by inverting at least part of the first address, and
upon receipt of the second read command associated with the second address,
the second address register stores the second address, and
the first address register stores a fourth address obtained by inverting at least part of the second address.

14. The method according to claim 13, wherein
the first address and the third address are different page addresses, and
the second address and the fourth address are different page addresses.

15. The method according to claim 14, wherein
the first address and the third address target the same word line, and
the second address and the fourth address target the same word line.

16. The method according to claim 15, wherein
the semiconductor memory device further comprises an input/output circuit connected to the first sense amplifiers and to the second sense amplifiers,
the first sense amplifiers read data from the first memory cells via the first bit lines,
the second sense amplifiers read data from the second memory cells via the second bit lines,
in response to the first read command,
the first sense amplifiers transfer the data read from the first memory cells to the input/output circuit, and thereafter the second sense amplifiers transfer the data read from the second memory cells to the input/output circuit, and
in response to the second read command,
the second sense amplifiers transfer the data read from the second memory cells to the input/output circuit, and thereafter the first sense amplifiers transfer the data read from the first memory cells to the input/output circuit.

17. The method according to claim 16, wherein
in response to the first read command,
the first sense amplifiers start transferring the data read from the first memory cells to the input/output circuit while one of the j kinds of voltages is applied to the one of the second word lines, and in response to the second read command, the second sense amplifiers start transferring the data read from the second memory cells to the input/output circuit, while one of the l kinds of voltages is applied to the one of the first word lines.

18. The method according to claim 17, wherein in response to a first data out command after the first read command, the input/output circuit starts outputting the data transferred from the first sense amplifiers, while one of the j kinds of voltages is applied to the one of the second word lines, and in response to a second data out command after the second read command, the input/output circuit starts outputting the data transferred from the second sense amplifiers, while one of the l kinds of voltages is applied to the one of the first word lines.

19. The method according to claim 11, wherein i is equal to k, and j is equal to l.

20. The method according to claim 11, wherein i and k are each 1, and j and l are each 2.

* * * * *